(12) United States Patent
Minami et al.

(10) Patent No.: US 8,654,045 B2
(45) Date of Patent: Feb. 18, 2014

(54) DISPLAY AND METHOD FOR MANUFACTURING DISPLAY

(75) Inventors: Tetsuo Minami, Tokyo (JP); Junichi Yamashita, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 1925 days.

(21) Appl. No.: 11/878,517

(22) Filed: Jul. 25, 2007

(65) Prior Publication Data

US 2008/0024413 A1 Jan. 31, 2008

(30) Foreign Application Priority Data

Jul. 31, 2006 (JP) .................................. 2006-207446
Jul. 31, 2006 (JP) .................................. 2006-207447

(51) Int. Cl.
*G09G 3/30* (2006.01)

(52) U.S. Cl.
USPC ................................. 345/80; 345/76; 345/205

(58) Field of Classification Search
USPC ......... 345/44, 45, 90, 92, 204–215, 690–699, 345/76, 80
See application file for complete search history.

(56) References Cited

U.S. PATENT DOCUMENTS

| 5,684,365 | A | 11/1997 | Tang et al. | |
|---|---|---|---|---|
| 6,496,171 | B2 * | 12/2002 | Yamazaki | 345/92 |
| 2001/0003477 | A1 * | 6/2001 | Aoki et al. | 349/152 |
| 2001/0040541 | A1 * | 11/2001 | Yoneda et al. | 345/87 |
| 2003/0001831 | A1 * | 1/2003 | Murade | 345/204 |
| 2005/0062106 | A1 * | 3/2005 | Noguchi et al. | 257/347 |
| 2006/0145960 | A1 * | 7/2006 | Koga et al. | 345/76 |
| 2006/0192497 | A1 * | 8/2006 | Hara et al. | 315/169.3 |
| 2008/0315428 | A1 * | 12/2008 | Fujii | 257/773 |

FOREIGN PATENT DOCUMENTS

| JP | 08-234683 | 9/1996 |
|---|---|---|
| JP | 11-271731 A | 10/1999 |
| JP | 2000-221926 A | 8/2000 |
| JP | 2002-341378 A | 11/2002 |
| JP | 2002-366057 A | 12/2002 |
| JP | 2003-017702 | 1/2003 |
| JP | 2003-091245 | 3/2003 |

(Continued)

OTHER PUBLICATIONS

Japanese Office Action issued Nov. 22, 2011 for corresponding Japanese Application No. 2006-207446.

(Continued)

*Primary Examiner* — Dmitriy Bolotin
(74) *Attorney, Agent, or Firm* — Rader, Fishman & Grauer PLLC

(57) ABSTRACT

According to an embodiment of the present invention, there is provided a display that includes a pixel array part having a plurality of pixel circuits that are arranged in a matrix and each have at least one transistor of which conduction state is controlled through reception of a drive signal to a control terminal, and a scanner including a plurality of buffers that are formed of transistors. The buffers correspond to a pixel arrangement and output a drive signal to the control terminals of the transistors included in the pixel circuits. The transistors in the pixel circuits and the transistors in the buffers are formed through irradiation with laser light that is moved for scanning in a predetermined direction and has a predetermined wavelength. The transistors in the buffers are formed in such a way that the channel length direction of the transistors is set parallel to the scan direction of the laser light.

30 Claims, 29 Drawing Sheets

(56) References Cited

FOREIGN PATENT DOCUMENTS

| | | |
|---|---|---|
| JP | 2003-108032 | 4/2003 |
| JP | 2003-173154 | 6/2003 |
| JP | 2003-330413 | 11/2003 |
| JP | 2004-094058 A | 3/2004 |
| JP | 2004-272193 | 9/2004 |
| JP | 2004-363625 A | 12/2004 |
| JP | 2005-010606 | 1/2005 |
| JP | 2005-107503 | 4/2005 |
| JP | 2005-108930 | 4/2005 |
| JP | 2005-114792 A | 4/2005 |
| JP | 2005-129895 | 5/2005 |
| JP | 2005-148571 | 6/2005 |
| JP | 2005-234077 A | 9/2005 |
| JP | 2006-113143 | 4/2006 |

OTHER PUBLICATIONS

Japanese Office Action issued Dec. 27, 2011 for corresponding Japanese Application No. 2006-207447.

Japanese Office Action issued Dec. 18, 2013 for corresponding Japanese Application No. 2012-8239 (2006-207446).

Japanese Office Action issued Feb. 7, 2012 for corresponding Japanese Application No. 2006-207446.

* cited by examiner

FIG.13

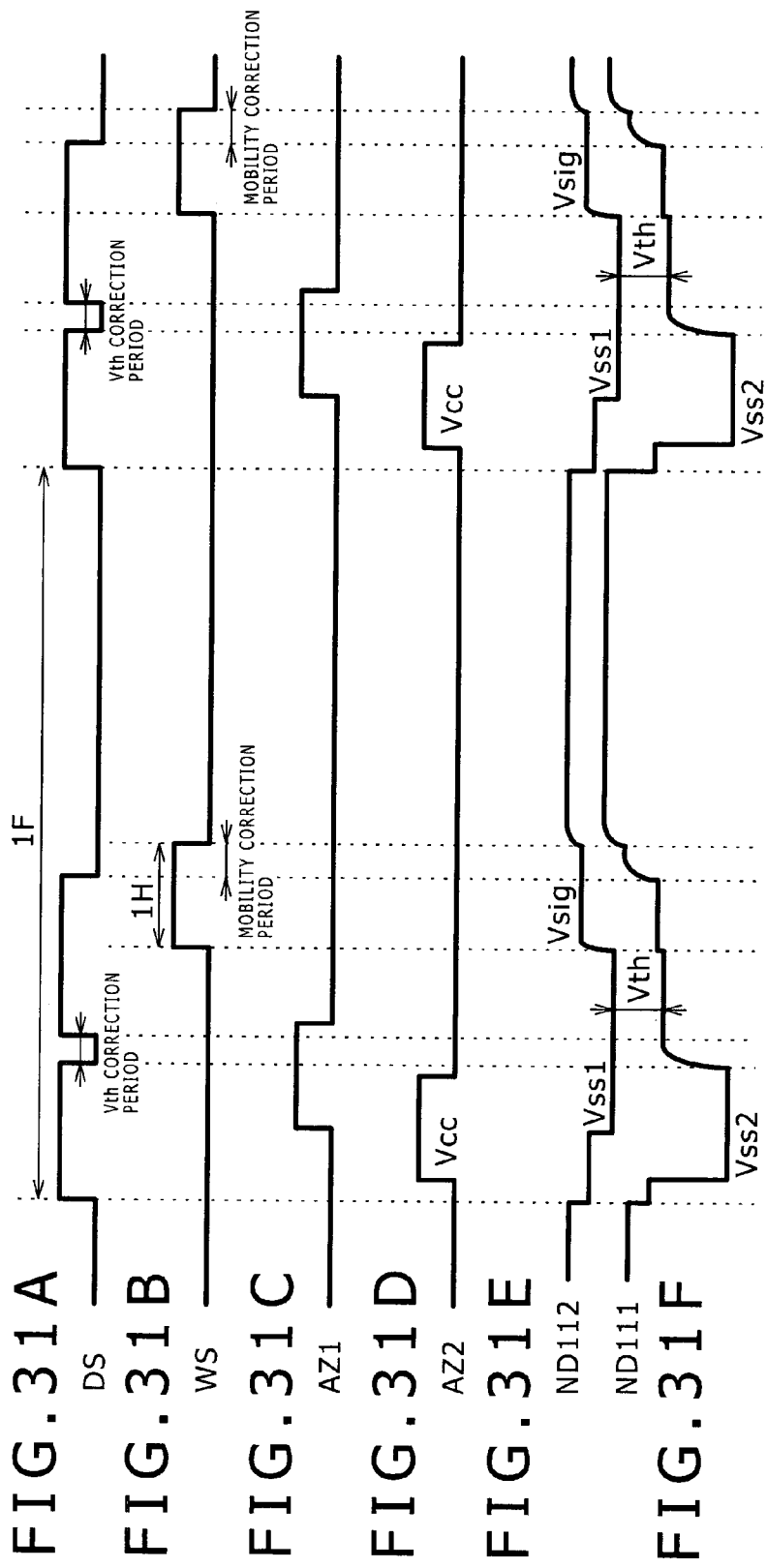

DISPLAY AND METHOD FOR MANUFACTURING DISPLAY

CROSS REFERENCES TO RELATED APPLICATIONS

The present invention contains subject matter related to Japanese Patent Application JP 2006-207446 and JP 2006-207447 filed in the Japan Patent Office on Jul. 31, 2006, the entire contents of which being incorporated herein by reference.

BACKGROUND OF THE INVENTION

1. Field of the Invention

The present invention relates to a display in which pixel circuits each having an electro-optical element are arranged in a matrix, such as an organic electroluminescence (EL) display, and a method for manufacturing the same.

2. Description of the Related Art

In an image display, e.g., in a liquid crystal display, a large number of pixels are arranged in a matrix, and the light intensity is controlled on each pixel basis in accordance with information on an image to be displayed, to thereby display the image.

This pixel-by-pixel control is implemented also in an organic EL display and the like similarly. The organic EL display has a light-emitting element in each pixel circuit, and therefore is a so-called self-luminous display. The organic EL display has the following advantages over the liquid crystal display: higher image visibility, no necessity for a backlight, and higher response speed.

Furthermore, the organic EL display is greatly different from the liquid crystal display and the like, in that a color grayscale is obtained through control of the luminance of each light-emitting element based on the value of the current flowing through the light-emitting element, i.e., the light-emitting elements are current-control elements.

The kinds of drive systems for the organic EL display include a simple-matrix system and an active-matrix system similarly to the liquid crystal display. The simple-matrix system has a simpler configuration but involves problems such as a difficulty in the realization of a large-size and high-definition display. Therefore, currently, the active-matrix system is being developed more actively. In the active-matrix system, the current that flows through a light-emitting element in each pixel circuit is controlled by active elements, typically by thin film transistors (TFTs), provided in the pixel circuit.

FIG. 1 is a block diagram showing the configuration of a typical organic EL display.

As shown in FIG. 1, a display 1 includes a pixel array part 2 in which pixel circuits (PXLC) 2a are arranged in an m×n matrix, a horizontal selector (HSEL) 3, and a write scanner (WSCN) 4. Furthermore, the display 1 includes data lines DTL1 to DTLn that are selected by the horizontal selector 3 and supplied with data signals in accordance with luminance information, and scan lines WSL1 to WSLm that are selected and driven by the write scanner 4.

The horizontal selector 3 and the write scanner 4 are formed on polycrystalline silicon in some cases, and are formed in the periphery of pixels as MOSICs or the like in other cases.

FIG. 2 is a circuit diagram showing one configuration example of the pixel circuit 2a of FIG. 1 (refer to e.g. U.S. Pat. No. 5,684,365 and Japanese Patent Laid-Open No. Hei 8-234683).

The pixel circuit of FIG. 2 has the simplest circuit configuration among a large number of proposed circuits, and is based on a so-called two-transistor drive system.

The pixel circuit 2a of FIG. 2 includes a p-channel thin-film field effect transistor (hereinafter, referred to as a TFT) 11, a p-channel TFT 12, a capacitor C11, and an organic EL element (OLED) 13 as a light-emitting element. Furthermore, in FIG. 2, DTL and WSL denote a data line and a scan line, respectively.

The organic EL element has a rectification function in many cases, and therefore is often referred to as an OLED (Organic Light Emitting Diode). Although a diode symbol is used for representation of a light-emitting element in FIG. 2 and other drawings, the OLED in the following description does not necessarily need to have a rectification function.

In FIG. 2, the source of the TFT 11 is connected to a supply potential VCC, and the cathode of the light-emitting element 13 is connected to a ground potential GND. The pixel circuit 2a of FIG. 2 operates as follows.

Step ST1:

When the scan line WSL is turned to the selected state (to a low level, in this example) and a writing potential Vdata is applied to the data line DTL, the TFT 12 conducts and thus the capacitor C11 is charged or discharged, so that the gate potential of the TFT 11 becomes Vdata.

Step ST2:

When the scan line WSL is turned to the non-selected state (to a high level, in this example), the data line DTL is electrically isolated from the TFT 11. However, the gate potential of the TFT 11 is stably held by the capacitor C11.

Step ST3:

The current that flows through the TFT 11 and the light-emitting element 13 has a current value dependent upon the voltage Vgs between the gate and source of the TFT 11, and the light-emitting element 13 continues to emit light with luminance dependent upon this current value.

Hereinafter, the operation of selecting the scan line WSL to thereby transmit luminance information supplied to the data line to the inside of a pixel, like that of the step ST1, will be expressed by using a verb "write".

In the pixel circuit 2a of FIG. 2, after the potential Vdata is written, the light-emitting element 13 continues to emit light with constant luminance until the next rewriting of the potential.

As described above, in the pixel circuit 2a, the voltage applied to the gate of the TFT 11 as a drive transistor is varied to control the value of the current flowing through the EL light-emitting element 13.

Because the source of the p-channel drive transistor is connected to the supply potential VCC, the TFT 11 typically operates in the saturation region. Therefore, the TFT 11 serves as a constant current source for a current having a value represented by Equation (1).

$$Ids = \frac{1}{2} \cdot \mu(W/L)Cox(Vgs-|Vth|)^2 \qquad (1)$$

In Equation (1), μ denotes the carrier mobility, Cox denotes the gate capacitance per unit area, and W and L denote the gate width and gate length, respectively. In addition, Vgs denotes the voltage between the gate and source of the TFT 11, and Vth denotes the threshold voltage of the TFT 11.

In a simple-matrix image display, each light-emitting element emits light only at the moment of being selected. In contrast, in the active-matrix system, each light-emitting element continues to emit light also after completion of writing as described above. Therefore, the active-matrix system is advantageous in driving of a large-size and high-definition display in particular, because the active-matrix system can decrease the peak luminance and peak current of the light-emitting elements compared with the simple-matrix system.

FIG. 3 is a diagram showing a change of the current-voltage (I-V) characteristic of an organic EL element over time. In FIG. 3, the full-line curve indicates the characteristic of the initial state, while the dashed-line curve indicates the characteristic after the change over time.

In general, the I-V characteristic of an organic EL element deteriorates with elapse of time as shown in FIG. 3.

However, the two-transistor driving of FIG. 2 is constant-current driving, and therefore a constant current continues to flow through the organic EL element as described above. Thus, even when the I-V characteristic of the organic EL element deteriorates, the light-emission luminance thereof does not change over time.

The pixel circuit 2a of FIG. 2 is formed of p-channel TFTs. If the pixel circuit 2a can be formed of n-channel TFTs, an existing amorphous silicon (a-Si) process can be used for TFT fabrication. This can reduce the cost of the TFT substrate.

A description will be made below about a basic pixel circuit obtained by replacing the transistors by n-channel TFTs.

FIG. 4 is a circuit diagram showing the pixel circuit obtained by replacing the p-channel TFTs in the circuit of FIG. 2 by n-channel TFTs.

A pixel circuit 2b of FIG. 4 includes n-channel TFTs 21 and 22, a capacitor C21, and an organic EL element (OLED) 23 as a light-emitting element. Furthermore, in FIG. 4, DTL and WSL denote a data line and a scan line, respectively.

In this pixel circuit 2b, the drain side of the TFT 21 as a drive transistor is connected to a supply potential VCC, and the source thereof is connected to the anode of the EL element 23, so that a source follower circuit is formed.

FIG. 5 is a diagram showing the operating point of the TFT 21 as the drive transistor and the EL element 23 in the initial state. In FIG. 5, the abscissa indicates the voltage Vds between the drain and source of the. TFT 21, while the ordinate indicates the current Ids between the drain and source of the TFT 21.

As shown in FIG. 5, the source voltage is determined by the operating point of the TFT 21 as the drive transistor and the EL element 23, and differs depending on the gate voltage.

Because the TFT 21 is driven in the saturation region, the TFT 21 outputs the current Ids with a current value in accordance with Equation (1), derived from the voltage Vgs corresponding to the source voltage of the operating point.

SUMMARY OF THE INVENTION

The above-described pixel circuit is the simplest circuit. However, a practical circuit includes also a drive transistor connected in series to an OLED, and TFTs for canceling the mobility and threshold voltage.

For these TFTs, gate pulses are generated by vertical scanners disposed on both the sides or on a single side of the active-matrix organic EL display panel, so that the pulse signals are applied via interconnects to the gates of desired TFTs in pixel circuits arranged in a matrix.

FIG. 6 is a block diagram showing a configuration example of the vertical scanner.

A vertical scanner 30 of FIG. 6 includes a shift register part 31, a clock pulse buffer part 32, an enable pulse buffer part 33, a logic part 34, and a buffer part 35.

The vertical scanner 30 applies pulse signals to the gates of transistors (TFTs) in the pixel circuits via the buffer part 35 as the final output stage.

When the number of the TFTs to which the pulse signals are applied in each pixel circuit is two or more, the timings of the application of the respective pulse signals are important.

An active-matrix organic EL panel is fabricated by integrating drive circuits employing p-Si•TFTs over a glass substrate by using a low-temperature process.

The low-temperature poly-Si•TFT has combined advantages of all of an a-Si•TFT, high-temperature poly-Si•TFT, and single-crystal Si•FET. Furthermore, the low-temperature poly-Si•TFT can realize a narrow frame, high definition, small thickness, and small weight.

The p-Si is formed by irradiating an a-Si film with high-power excimer laser pulses (with a wavelength of 308 nm) to thereby subject the a-Si film to melting, cooling, and solidification. This method is referred to as excimer laser anneal (ELA), and can achieve high-quality p-Si across a large area at a low temperature.

In an ELA step, as shown in FIG. 7, an excimer laser is moved on a panel in one direction for scanning of the panel.

However, the output power of the excimer laser varies along the scan direction, which yields differences in TFT characteristics among TFTs arranged along the scan direction.

This problem will be described in association with FIG. 7 as an example, with attention paid on transistors (TFTs) TR included in buffers disposed on the respective stages of the vertical scanner 30.

In FIG. 7, the direction of the channel length (L-length: current flow direction) of each transistor TR is set parallel to the lateral direction in FIG. 7, and an excimer laser is moved for scanning downward in this drawing. In this case, because the output power of the excimer laser varies along the scan direction, differences in transistor characteristics such as the threshold voltage and mobility arise among drive transistors in buffers 351-N, 351-N+1, and 351-N+2, shown in FIG. 8, on the N-th stage, the N+1-th stage, and the N+2-th stage, respectively, of the buffer part 35 in the vertical scanner 30.

FIG. 9 is a diagram for explaining a reason for the occurrence of the variation in transistor characteristics.

As shown in FIG. 9, when an excimer laser is moved for scanning downward in the drawing, large-grain-size parts and small-grain-size parts are generated in terms of the crystalline structure of transistors because the output power of the excimer laser varies along the scan direction.

Because the channel width W of the transistors is small, the variation in the grain size is not averaged. As a result, variation among the respective transistors arises, and hence the buffers involve large differences.

Consequently, as shown in FIG. 10, the phase and transient of pulses input to pixels vary, which yields differences in the mobility correction period and threshold voltage (Vth) cancel period among the respective stages. These differences are visually recognized as streaks disadvantageously.

FIG. 10 is a diagram showing an image of the transient when the capacitance C is constant but there is variation in the resistance R. In the example of FIG. 10, the resistance R1 of the N-th stage and the resistance R2 of the N+1-th stage have the relationship R1<R2.

In practice, the operating point is shifted due to a difference in the transient and so on, and thus an error in the drive timing is caused, which results in streak unevenness and so on.

FIG. 11 is a diagram showing an arrangement example of a pixel array part.

In the pixel array part of FIG. 11, one pixel is formed by arranging subpixels 502R, 502G, and 502B of red, green, and blue in a stripe manner.

When the number of TFTs to which pulse signals are applied from vertical scanners in each pixel circuit is two or more, the timings of the application of the respective pulse signals are important.

FIG. 12 shows an example in which the respective pixels of R, G, and B are arranged in a stripe manner in such a way that the direction of the channel length (L-length) of a drive transistor (current flow direction) in each pixel is set parallel to the vertical direction of the drawing, and an excimer laser is moved for scanning from the left to the right in the drawing. In this example, because the output power of the excimer laser varies along the scan direction, the characteristics of the drive transistor differ between the R pixels and G pixels, and between the G pixels and B pixels, across the pixel boundary.

This is because the size of generated crystal grains varies due to the variation in the output power of the excimer laser.

Because the output power of an excimer laser varies along the scan direction, a difference in the grain sizes in the channel of the transistor, i.e., in the current flow path of the transistor, arises e.g. between the pixel G2 and the pixel B2, which yields a difference therebetween in transistor characteristics such as the threshold voltage and mobility.

Furthermore, due also to original color differences among the pixels, disadvantages are caused that the boundaries are visually recognized as streaks to a further extent, and the boundaries are visually recognized as colored ones.

There is a need for the present invention to provide a display that is allowed to suppress the occurrence of the above-described streaks and a method for manufacturing the same.

According to a first embodiment of the present invention, there is provided a display that includes a pixel array part configured to include a plurality of pixel circuits that are arranged in a matrix and each have at least one transistor of which conduction state is controlled through reception of a drive signal to a control terminal, and a scanner configured to include a plurality of buffers that are formed of transistors. The buffers correspond to a pixel arrangement and output a drive signal to the control terminals of the transistors included in the pixel circuits. The transistors in the pixel circuits and the transistors in the buffers are formed through irradiation with laser light that is moved for scanning in a predetermined direction and has a predetermined wavelength. The transistors in the buffers are formed in such a way that the channel length direction of the transistors is set parallel to the scan direction of the laser light.

According to a second embodiment of the present invention, there is provided another display that includes a pixel array part configured to include a plurality of pixel circuits that are arranged in a matrix and each have at least one transistor of which conduction state is controlled through reception of a drive signal to a control terminal, and a scanner configured to include a buffer group that is formed of transistors. The buffer group corresponds to a pixel arrangement and outputs a drive signal to the control terminals of the transistors included in the pixel circuits. The transistors in the pixel circuits and the transistors in the buffer group are formed through irradiation with laser light that is moved for scanning in a predetermined direction and has a predetermined wavelength. The scanner is formed in such a way that the arrangement direction of the buffer group is set perpendicular to the scan direction.

According to a third embodiment of the present invention, there is provided a method for manufacturing a display that includes a pixel array part having a plurality of pixel circuits that are arranged in a matrix and each have at least one transistor of which conduction state is controlled through reception of a drive signal to a control terminal. The display includes at least one scanner having a plurality of buffers that are formed of transistors. The buffers correspond to a pixel arrangement and output a drive signal to the control terminals of the transistors included in the pixel circuits. The method includes the step of forming the transistors in the pixel circuits and the transistors in the buffers by solidification through irradiation with laser light that is moved for scanning in a predetermined direction and has a predetermined wavelength. The transistors in the buffers are formed in such a way that the channel length direction of the transistors is set parallel to the scan direction of the laser light.

According to a fourth embodiment of the present invention, there is provided another method for manufacturing a display that includes a pixel array part having a plurality of pixel circuits that are arranged in a matrix and each have at least one transistor of which conduction state is controlled through reception of a drive signal to a control terminal. The display includes at least one scanner having a buffer group that is formed of transistors. The buffer group corresponds to a pixel arrangement and outputs a drive signal to the control terminals of the transistors included in the pixel circuits. The method includes the step of forming the transistors in the pixel circuits and the transistors in the buffer group by solidification through irradiation with laser light that is moved for scanning in a predetermined direction and has a predetermined wavelength. The buffer group in the scanner is formed in such a way that the arrangement direction of the buffer group is set perpendicular to the scan direction of the laser light.

According to the embodiments of the present invention, e.g. in a crystallization step by use of a laser having a predetermined wavelength for a display, the vertical scan direction of the laser is set parallel to the direction of the L-length (channel length) of transistors (current flow direction) included in buffers in a vertical scanner.

Due to variation in the output power of the laser, the size of generated crystal grains varies. However, the size of the crystal grains varies along the L-length direction of the transistors, i.e., along the direction of the current flow path. Therefore, the variation in each drive transistor is averaged, and thus differences in characteristics are small.

According to a fifth embodiment of the present invention, there is provided a display that includes a pixel array part configured to include a plurality of pixel circuits that are arranged and each have at least one transistor of which conduction state is controlled through reception of a drive signal to a control terminal. The transistors in the pixel circuits are formed through irradiation with laser light that is moved for scanning in a predetermined direction and has a predetermined wavelength. The pixel circuits in the pixel array part are formed in such a way that the arrangement direction of pixels that are arranged in a stripe is set parallel to the scan direction of the laser light.

According to a sixth embodiment of the present invention, there is provided another display that includes a pixel array part configured to include a plurality of pixel circuits that are arranged in a matrix and each have at least one transistor of which conduction state is controlled through reception of a drive signal to a control terminal. The transistors in the pixel circuits and transistors in buffers are formed through irradiation with laser light that is moved for scanning in a predetermined direction and has a predetermined wavelength. The pixel array part is formed to include both the pixel circuit in which the channel length direction of the transistor is set parallel to the scan direction of the laser light and the pixel circuit in which the channel length direction of the transistor is set perpendicular to the scan direction of the laser light.

According to a seventh embodiment of the present invention, there is provided a method for manufacturing a display that includes a pixel array part having a plurality of pixel circuits that are arranged and each have at least one transistor of which conduction state is controlled through reception of a drive signal to a control terminal. The method includes the step of forming the transistors in the pixel circuits by solidification through irradiation with laser light that is moved for scanning in a predetermined direction and has a predetermined wavelength. The pixel circuits in the pixel array part are formed in such a way that the arrangement direction of pixels that are arranged in a stripe is set parallel to the scan direction of the laser light.

According to an eighth embodiment of the present invention, there is provided another method for manufacturing a display that includes a pixel array part having a plurality of pixel circuits that are arranged and each have at least one transistor of which conduction state is controlled through reception of a drive signal to a control terminal. The method includes the step of forming the transistors in the pixel circuits by solidification through irradiation with laser light that is moved for scanning in a predetermined direction and has a predetermined wavelength. The pixel array part is formed to include both the pixel circuit in which the channel length direction of the transistor is set parallel to the scan direction of the laser light and the pixel circuit in which the channel length direction of the transistor is set perpendicular to the scan direction of the laser light.

According to the fifth to eighth embodiments of the present invention, e.g. in a crystallization step by use of a laser having a predetermined wavelength for a display, the scan direction of the laser beam is set parallel to the arrangement direction of the pixels arranged in a stripe.

The output power of the laser beam varies along the scan direction, and therefore differences in characteristics arise among the transistors on a column of the same color. However, because the differences are among the transistors of the same color, streaks at the boundaries between columns are hardly recognized visually.

The embodiments of the present invention can suppress the occurrence of streaks attributed to differences in characteristics among transistors in a vertical scanner.

Furthermore, the embodiments of the present invention can prevent the boundaries between columns of pixels arranged in a stripe from being visually recognized as streaks, and can prevent the boundaries from being visually recognized as colored ones.

BRIEF DESCRIPTION OF THE DRAWINGS

FIG. 13 is a diagram showing the configuration of an organic EL display that employs pixel circuits according to an embodiment of the present invention;

FIGS. 31A to 31F are a timing chart for explaining the operation of the embodiment.

DETAILED DESCRIPTION OF THE PREFERRED EMBODIMENTS

Embodiments of the present invention will be described below in association with the drawings.

Figure 13:
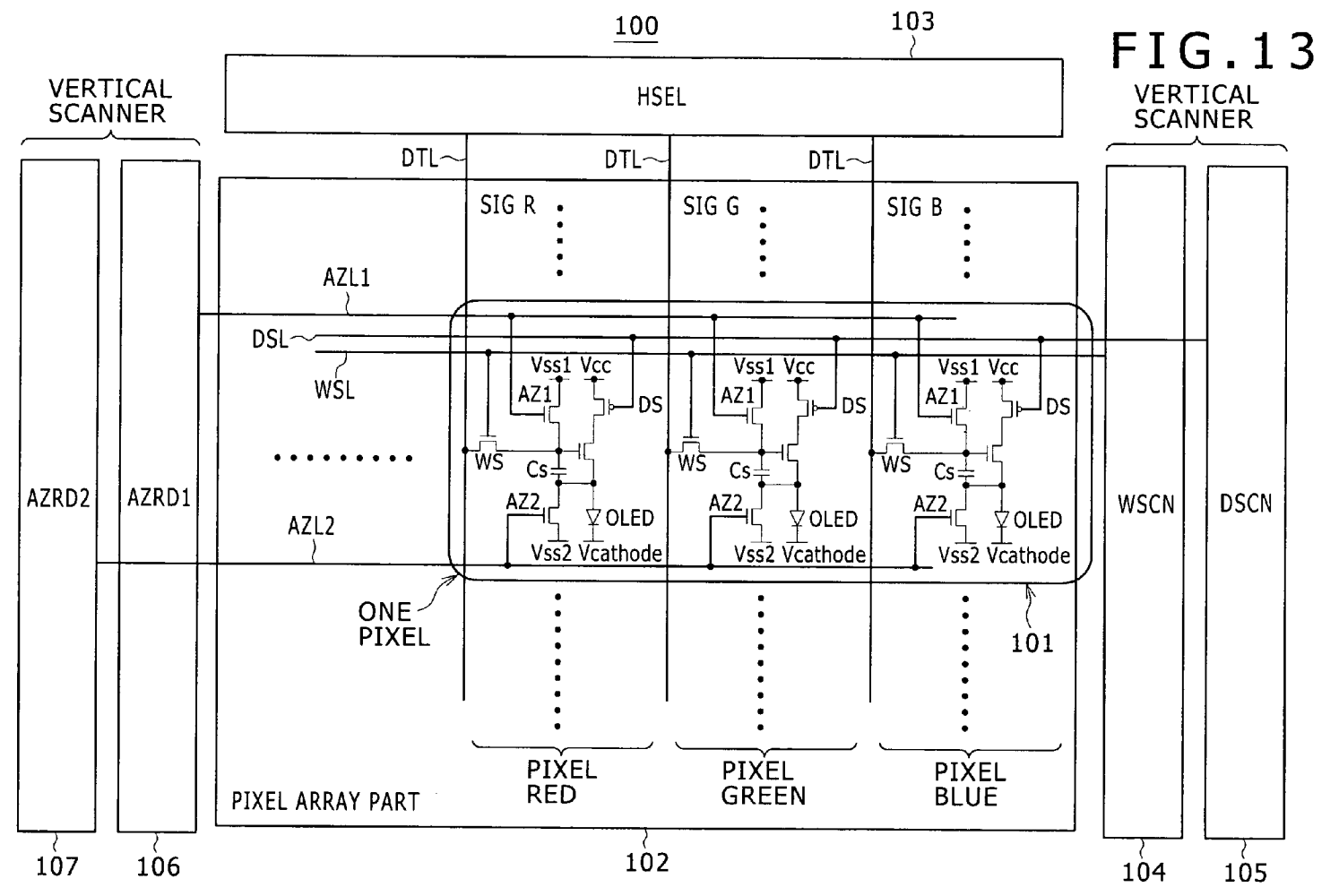

FIG. 13 is a diagram showing the configuration of an organic EL display that employs pixel circuits according to an embodiment of the present invention.

Figure 1:
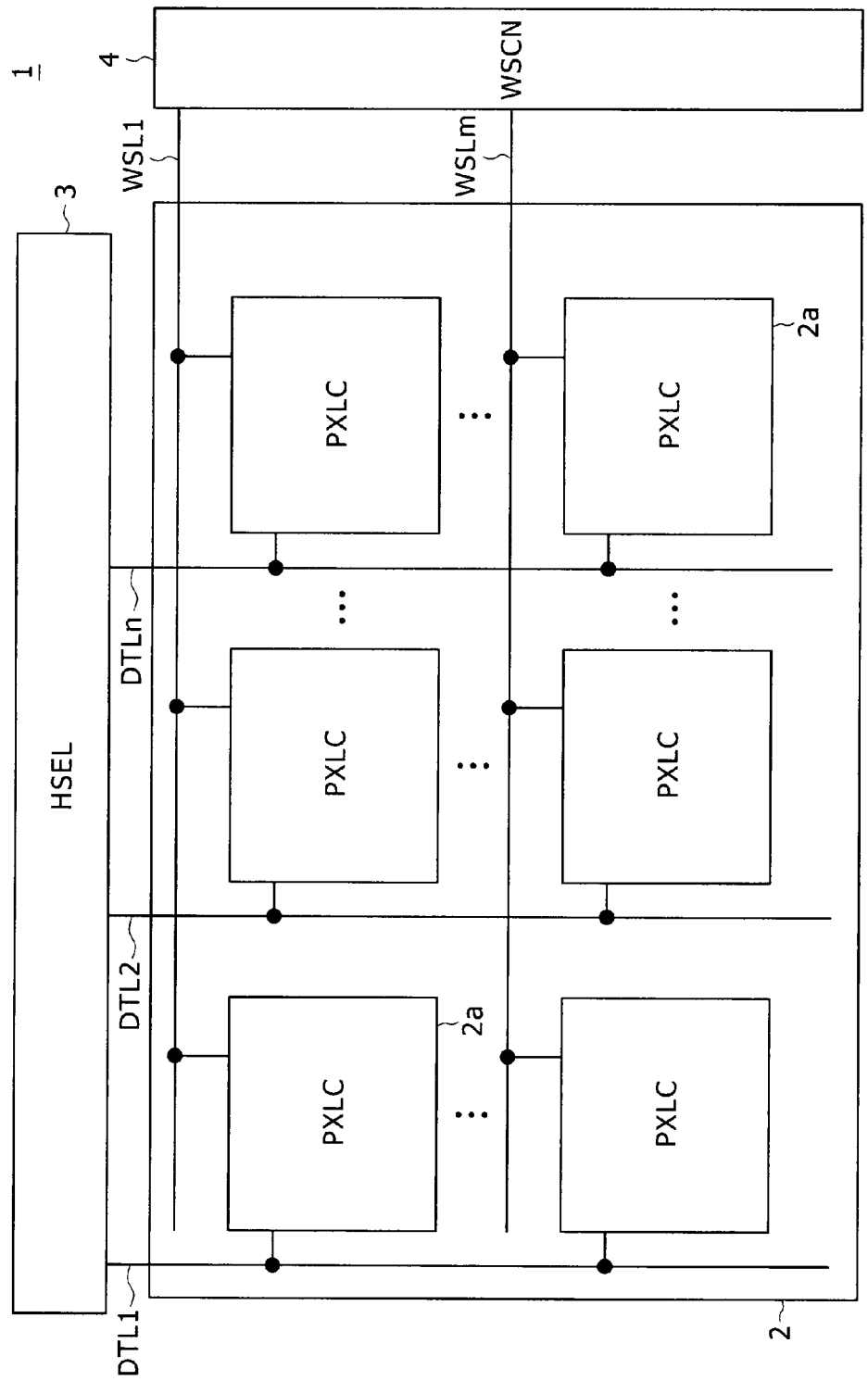
FIG. 1 is a block diagram showing the configuration of a typical organic EL display.
Figure 2:
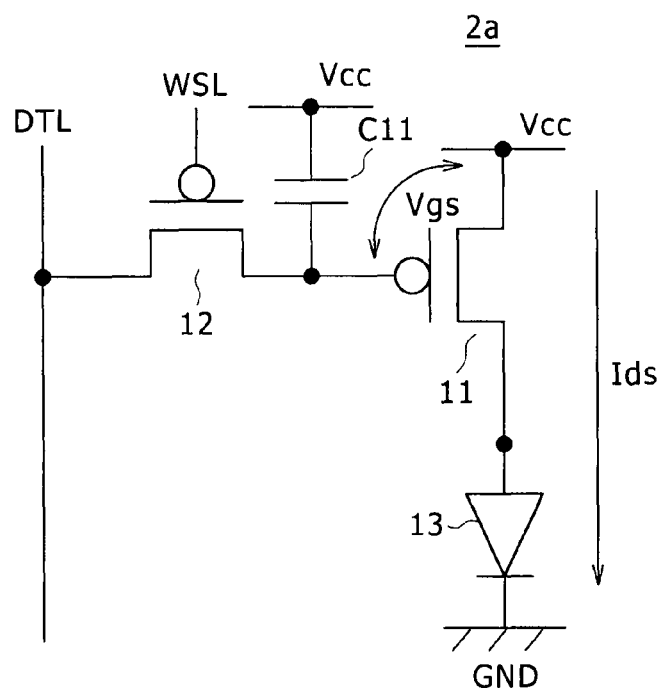
FIG. 2 is a circuit diagram showing one configuration example of a pixel circuit of FIG. 1.
Figure 3:
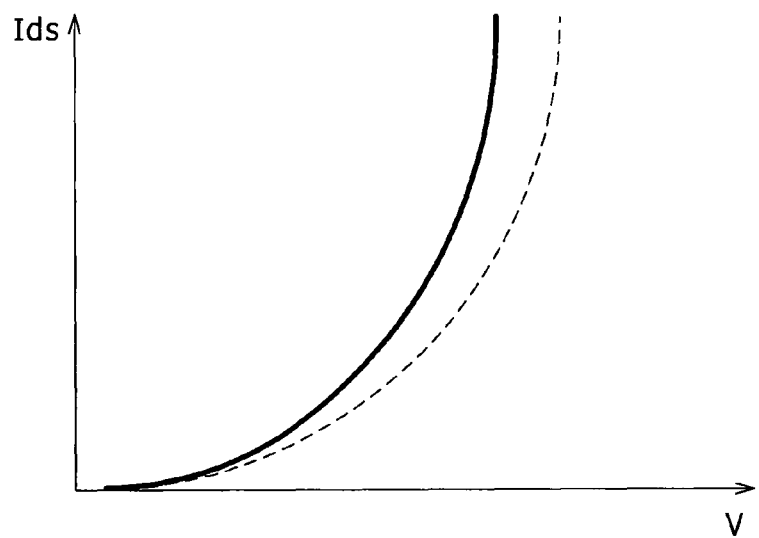
FIG. 3 is a diagram showing a change of the current-voltage (I-V) characteristic of an organic EL element over time.
Figure 4:
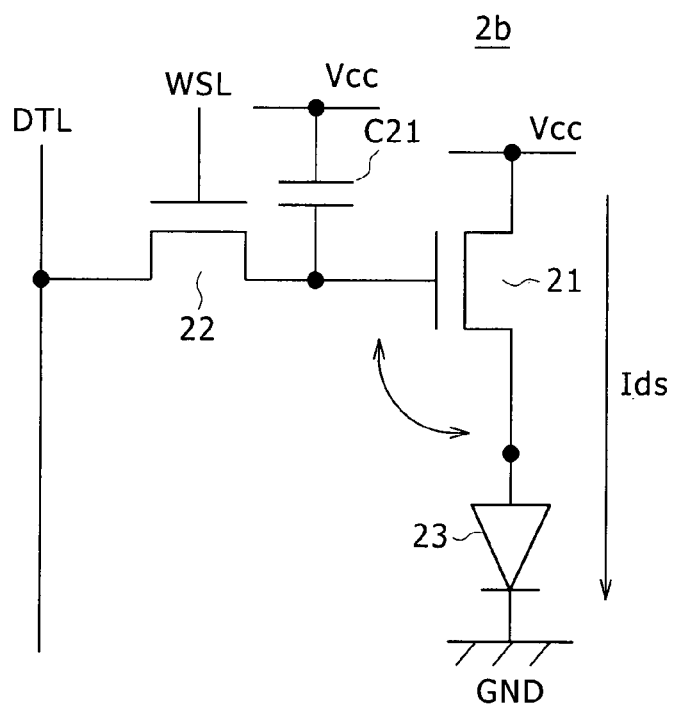
FIG. 4 is a circuit diagram showing a pixel circuit obtained by replacing p-channel TFTs in the circuit of FIG. 2 by n-channel TFTs.
Figure 5:
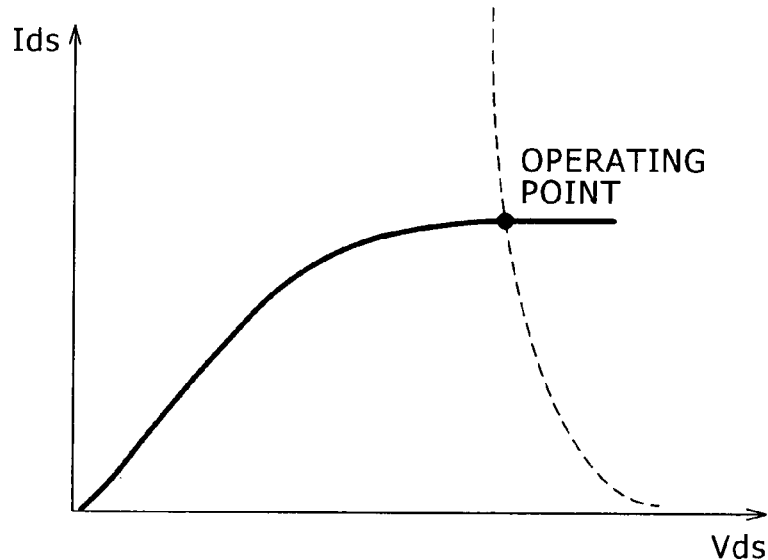
FIG. 5 is a diagram showing the operating point of a TFT as a drive transistor and an EL element in the initial state.
Figure 6:
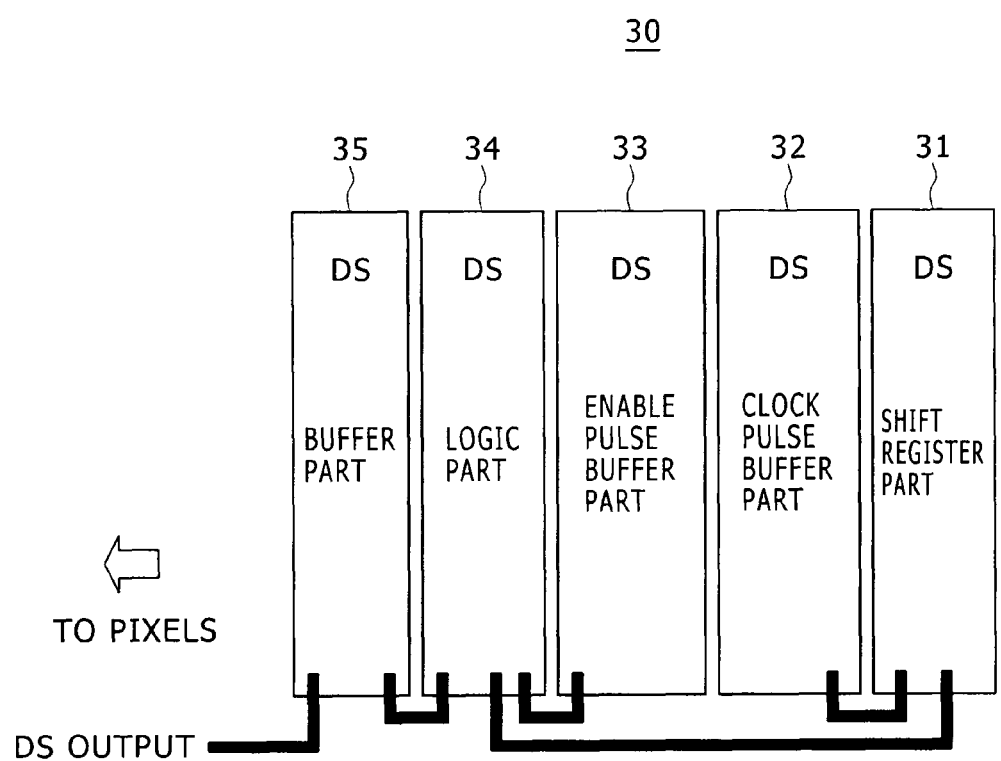
FIG. 6 is a block diagram showing a configuration example of a vertical scanner.
Figure 7:
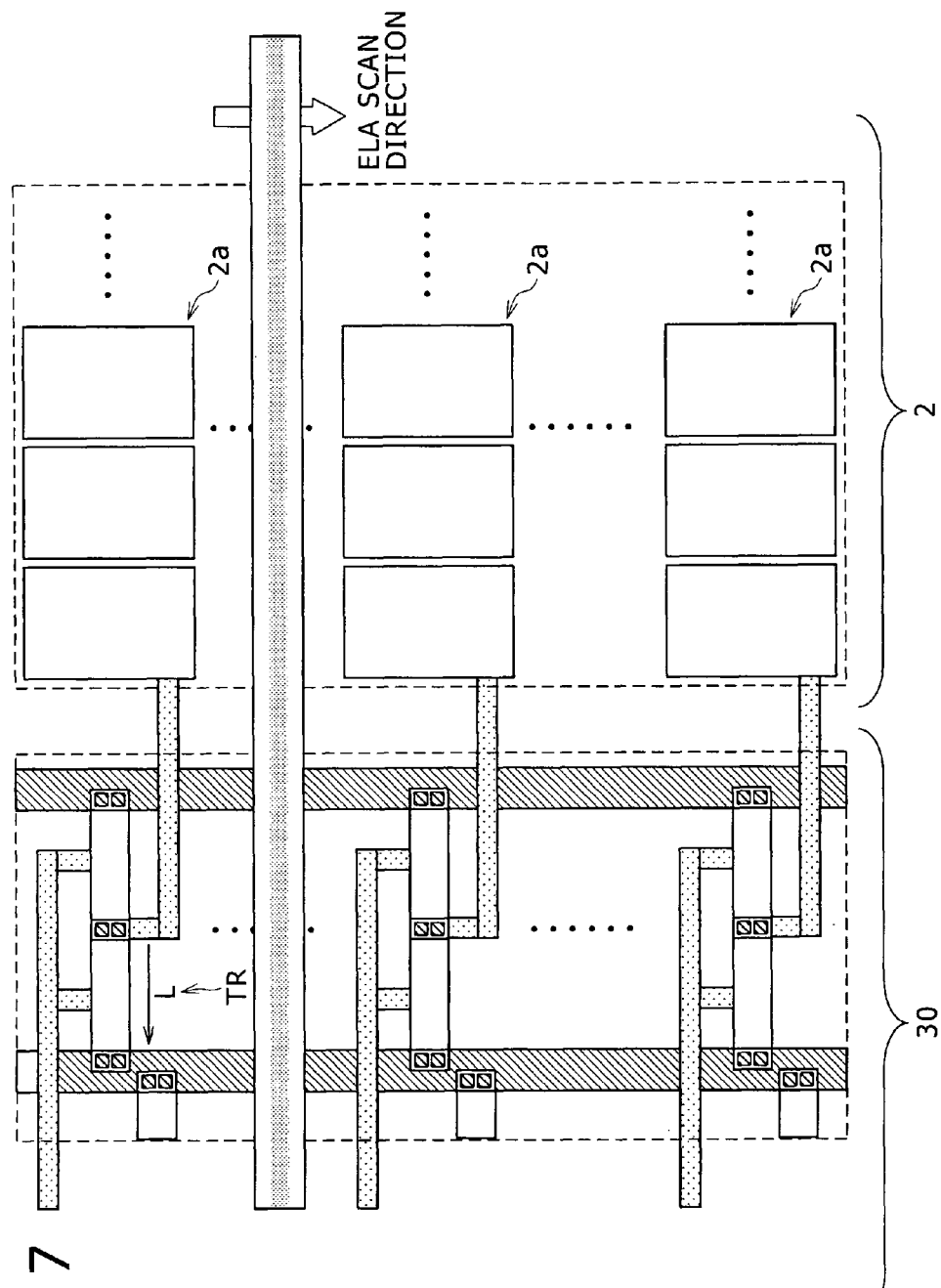
FIG. 7 is a diagram for explaining the scan direction of an excimer laser in an ELA step.
Figure 8:
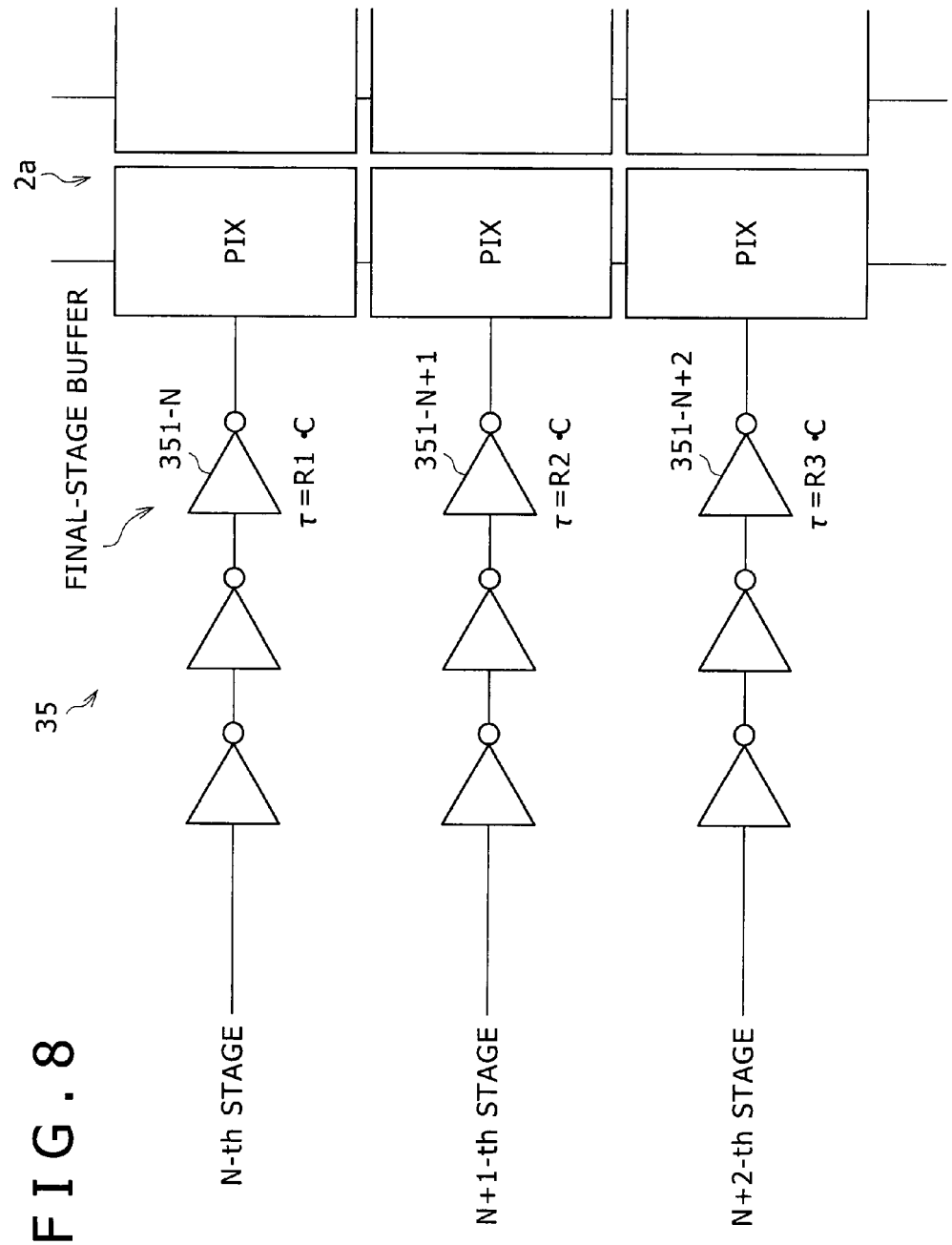
FIG. 8 is a diagram schematically showing the output part of the final-stage buffer part in a vertical scanner.
Figure 9:
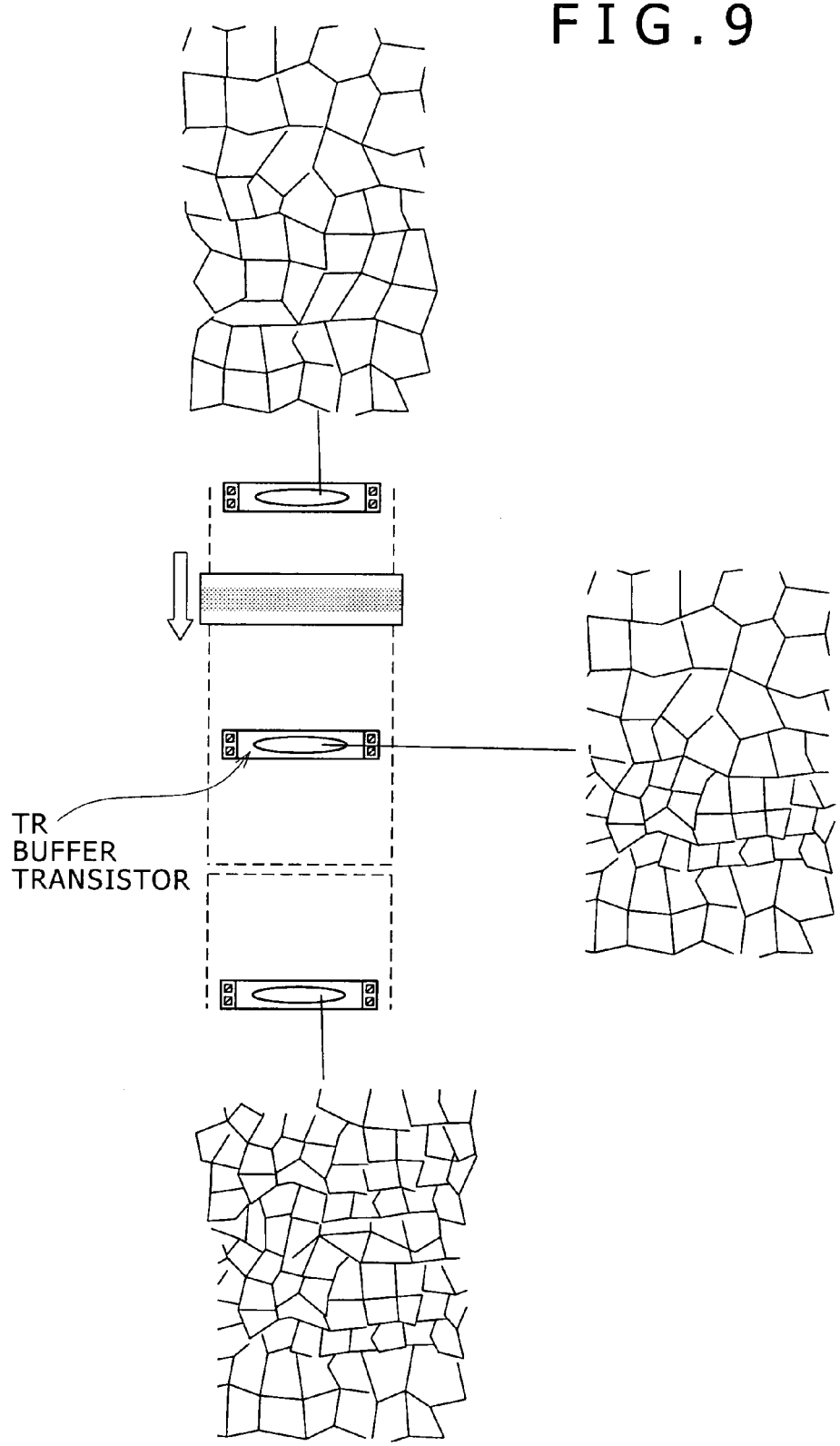
FIG. 9 is a diagram for explaining a reason for the occurrence of variation in transistor characteristics.
Figure 10:
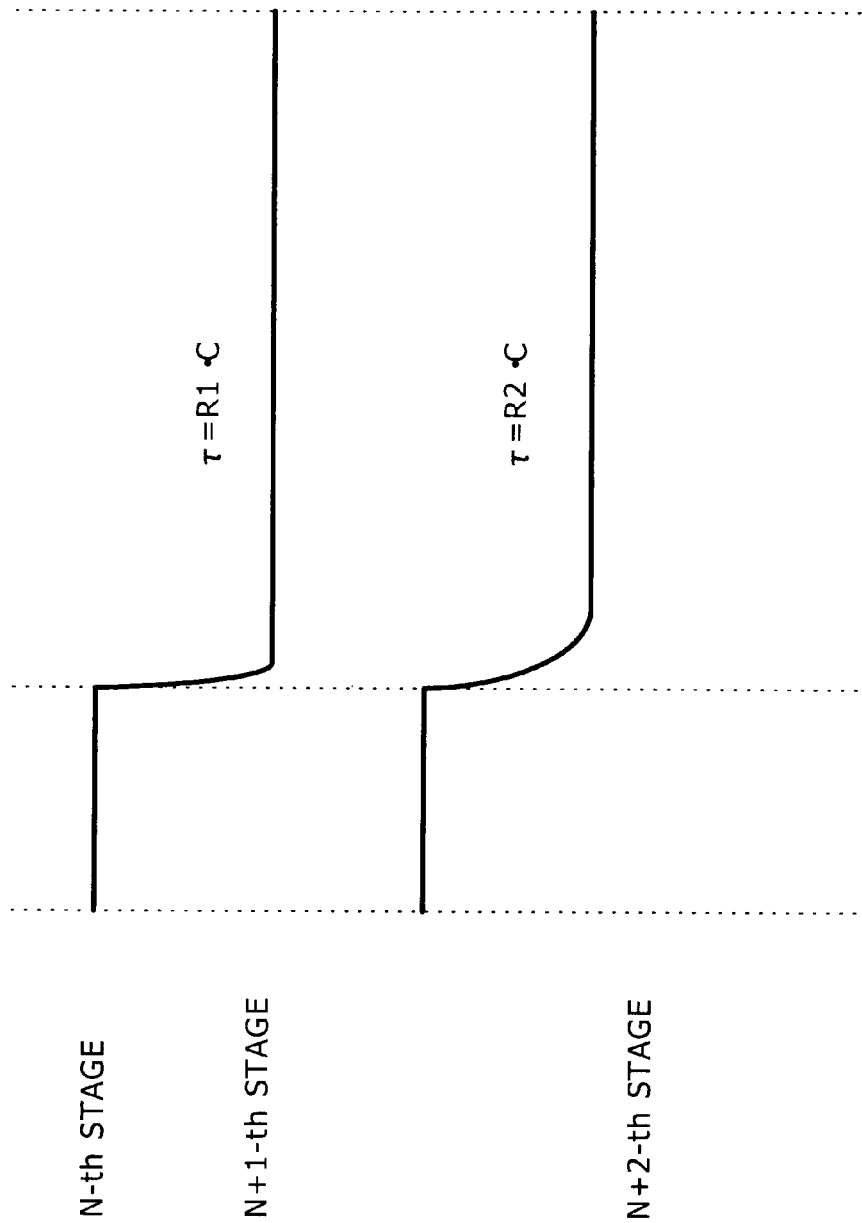
FIG. 10 is a diagram showing an image of the transient when a capacitance C is constant but there is variation in a resistance R.
Figure 11:
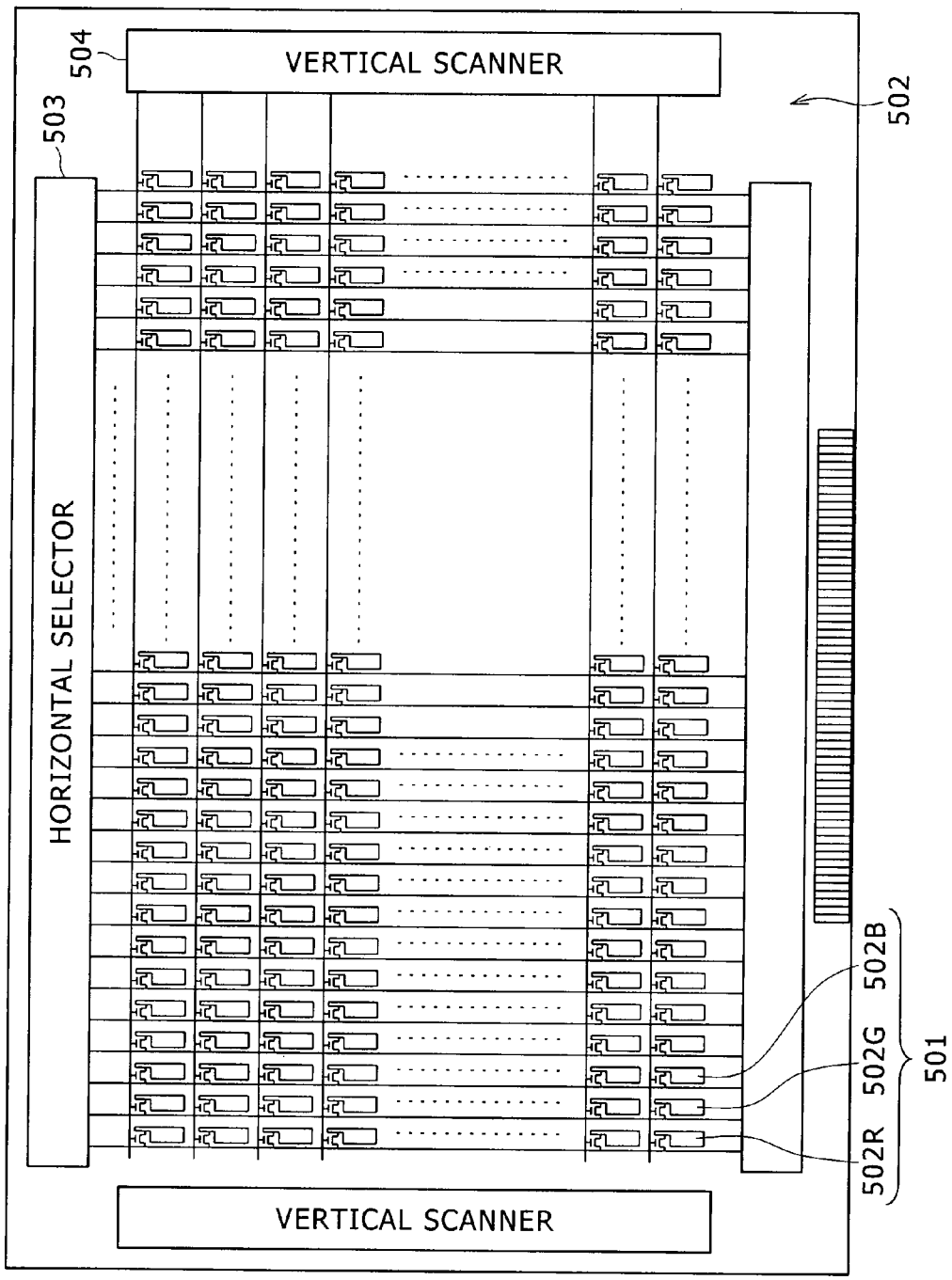
FIG. 11 is a diagram showing an arrangement example of a pixel array part.
Figure 12:
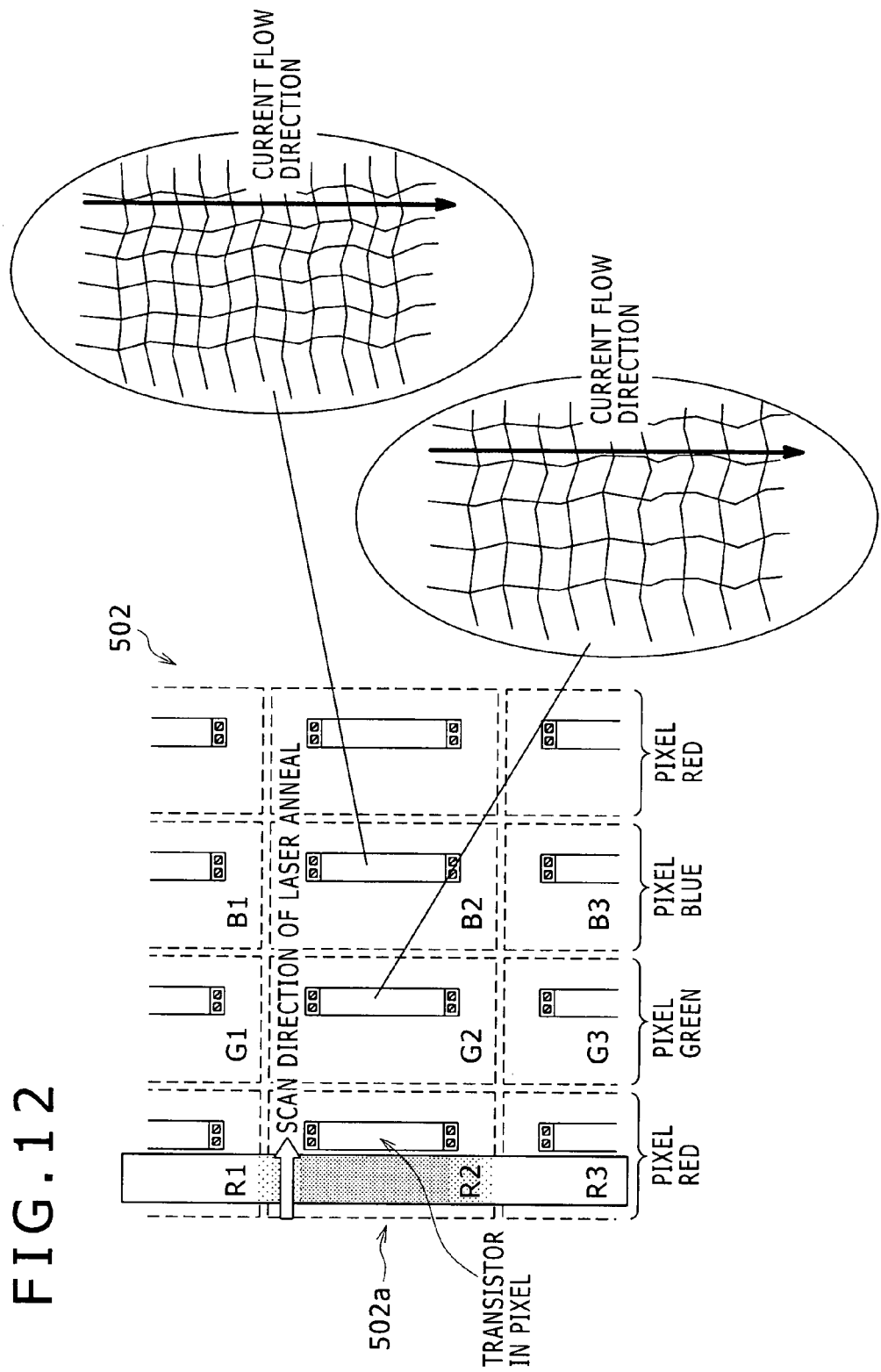
FIG. 12 is a diagram for explaining a reason for the occurrence of variation in transistor characteristics.
Figure 14:
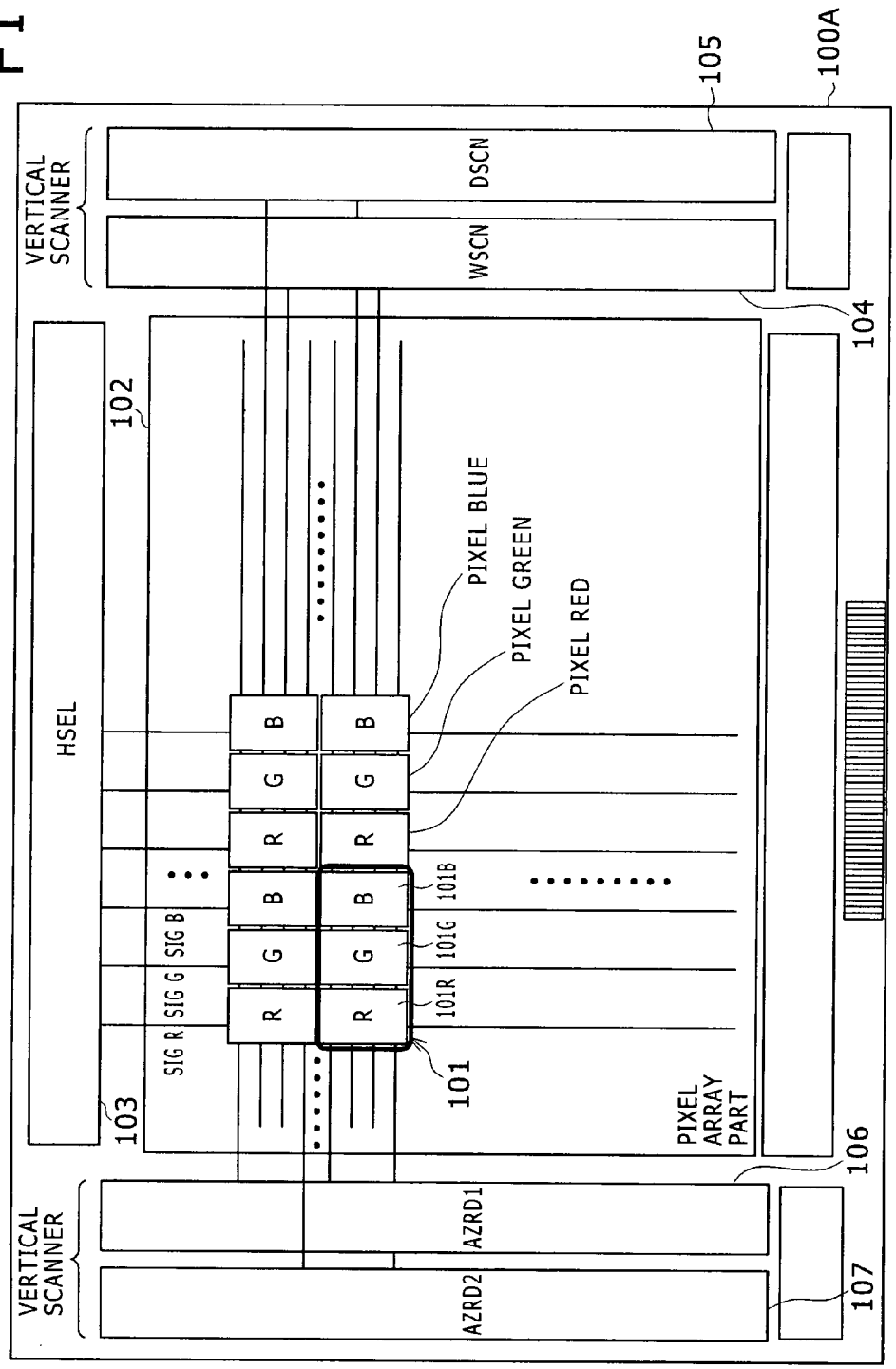
FIG. 14 is a diagram schematically showing an organic EL display panel according to an embodiment of the present invention.

FIG. 14 is a diagram schematically showing an organic EL display panel according to an embodiment of the present invention.

Figure 15:
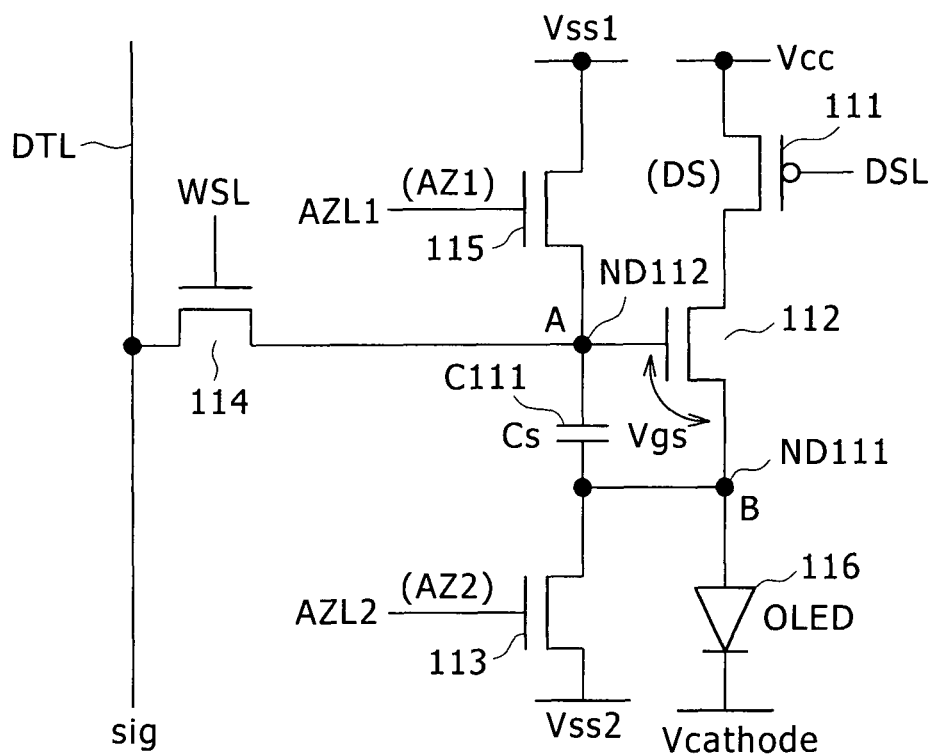
FIG. 15 is a circuit diagram showing the specific configuration of the pixel circuit according to the embodiment.

FIG. 15 is a circuit diagram showing the specific configuration of the pixel circuit according to the present embodiment.

As shown in FIGS. 13 and 14, a display 100 includes a pixel array part 102 in which pixel circuits 101 are arranged in an m×n matrix, a horizontal selector (HSEL) 103, a write scanner (WSCN) 104, a drive scanner (DSCN) 105, a first auto-zero circuit (AZRD1) 106, and a second auto-zero circuit (AZRD2) 107. In addition, the display 100 includes also data lines DTL that are selected by the horizontal selector 103 and supplied with data signals in accordance with luminance information, scan lines WSL that are selected and driven by the write scanner 104 as second drive interconnects, and drive lines DSL that are selected and driven by the drive scanner 105 as first drive interconnects. Moreover, the display 100 further includes first auto-zero lines AZL1 that are selected and driven by the first auto-zero circuit 106 as fourth drive interconnects, and second auto-zero lines AZL2 that are selected and driven by the second auto-zero circuit 107 as third drive interconnects.

These components are formed in an active-matrix organic EL display panel 100A shown in FIG. 14.

As shown in FIG. 14, for a pixel circuit 101 according to the present embodiment, one pixel is formed by arranging sub-pixels 101R, 101G, and 101B of red, green, and blue in a stripe manner.

As shown in FIGS. 13 and 15, the pixel circuit 101 according to the present embodiment includes a p-channel TFT 111, n-channel TFTs 112 to 115, a capacitor C111, a light-emitting element 116 formed of an organic EL element (OLED: electro-optical element), a first node (point A) ND111, and a second node (point B) ND112.

The TFT 111 serves as a first switch transistor, and the TFT 113 serves as a second switch transistor. Furthermore, the TFT 115 serves as a third switch transistor, and the TFT 114 serves as a fourth switch transistor.

A supply line for a supply voltage VCC (supply potential) is equivalent to a first reference potential, and a ground potential GND is equivalent to a second reference potential. Furthermore, a potential VSS1 is equivalent to a fourth reference potential, and a potential VSS2 is equivalent to a third reference potential.

In the pixel circuit 101, between the first reference potential (the supply potential VCC in the present embodiment) and the second reference potential (the ground potential GND in the present embodiment), the TFT 111, the TFT 112 as a drive transistor, the first node ND111, and the light-emitting element (OLED) 116 are connected in series to each other. Specifically, the cathode of the light-emitting element 116 is connected to the ground potential GND, and the anode thereof is connected to the first node ND111. The source of the TFT 112 is connected to the first node ND111, and the drain thereof is connected to the drain of the TFT 111. The source of the TFT 111 is connected to the supply potential VCC.

Furthermore, the gate of the TFT 112 is connected to the second node ND112, and the gate of the TFT 111 is connected to the drive line DSL.

The drain of the TFT 113 is connected to the first node ND111 and a first electrode of the capacitor C111, and the source thereof is connected to the fixed potential VSS2. The gate of the TFT 113 is connected to the second auto-zero line AZL2. A second electrode of the capacitor C111 is connected to the second node ND112.

The source and drain of the TFT 114 are connected to the data line DTL and the second node ND112, respectively. The gate of the TFT 114 is connected to the scan line WSL.

Furthermore, the source and drain of the TFT 115 are connected to the second node ND112 and the predetermined potential VSS1, respectively. The gate of the TFT 115 is connected to the first auto-zero line AZL1.

In this manner, in the pixel circuit 101 according to the present embodiment, the capacitor C111 as a pixel capacitance element is connected between the gate and source of the TFT 112 as the drive transistor. In a non-emission period, the source of the TFT 112 is connected to a fixed potential via the TFT 113 as a switch transistor and the gate and drain of the TFT 112 are connected to each other, to thereby correct the threshold voltage Vth.

For example, the threshold voltage Vth is corrected in a period during which the TFT 115 is in the on-state and the TFT 113 is in the off-state.

Furthermore, the mobility is corrected in a period during which the on-period of the TFT 111 and the on-period of the TFT 114 overlap with each other.

The driving for the mobility correction, threshold voltage cancel, and so on is controlled based on the phase difference between two kinds of pulses. Therefore, the timings of the respective pulses are important.

Figure 16:
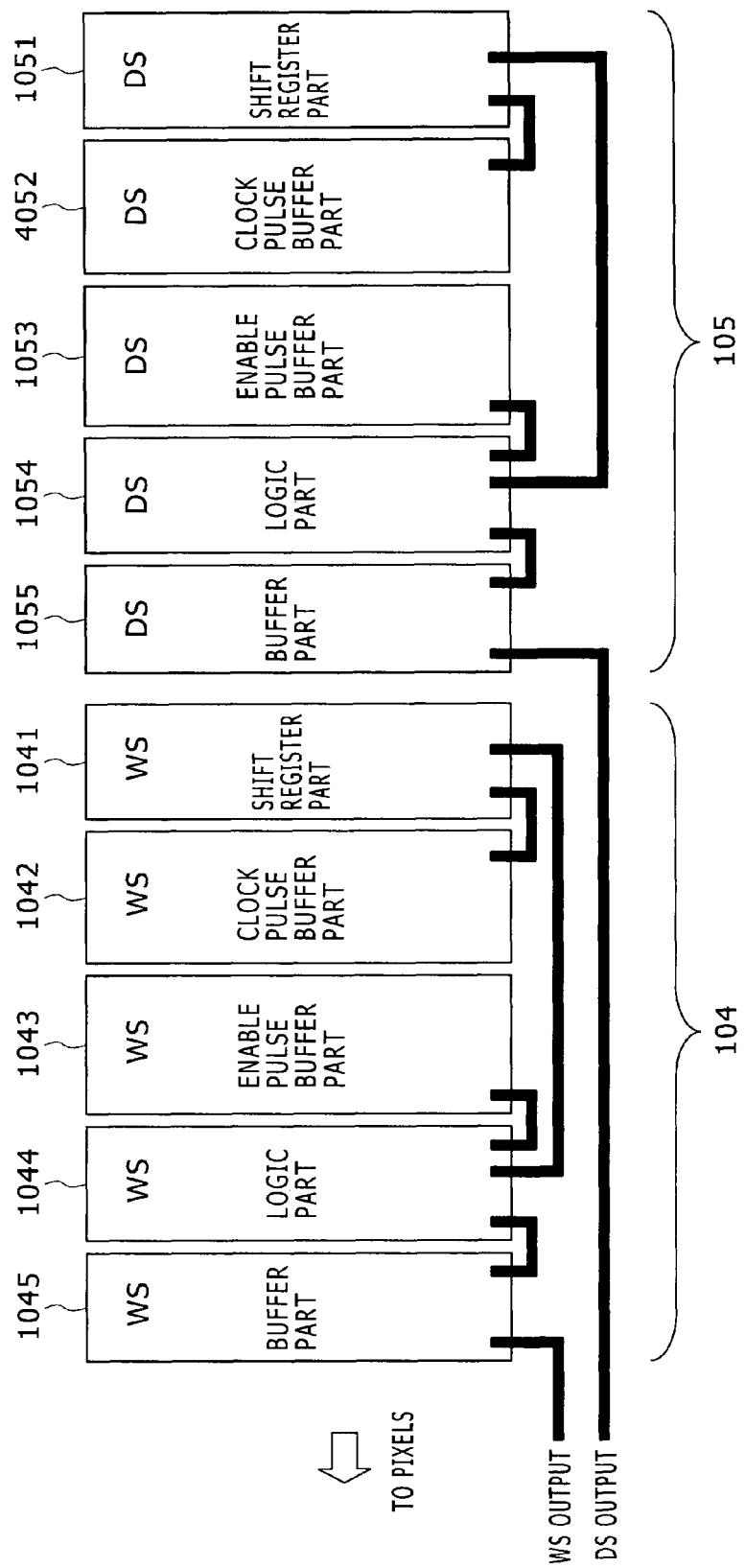
FIG. 16 is a block diagram showing a configuration example of a write scanner and a drive scanner as a vertical scanner according to the embodiment.

FIG. 16 is a block diagram showing a configuration example of the write scanner 104 and the drive scanner 105 as the vertical scanner according to the present embodiment.

The write scanner 104 of FIG. 16 includes a shift register part 1041, a clock pulse buffer part 1042, an enable pulse buffer part 1043, a logic part 1044, and a buffer part 1045.

Similarly, the drive scanner 105 of FIG. 16 includes a shift register part 1051, a clock pulse buffer part 1052, an enable pulse buffer part 1053, a logic part 1054, and a buffer part 1055.

The write scanner 104 and the drive scanner 105 apply pulse signals to the gates of transistors (TFTs) in the pixel circuits via the buffer parts 1045 and 1055 as the final output stage.

When the number of the TFTs to which the pulse signals are applied in each pixel circuit is two or more, the timings of the application of the respective pulse signals are important.

Figure 17:
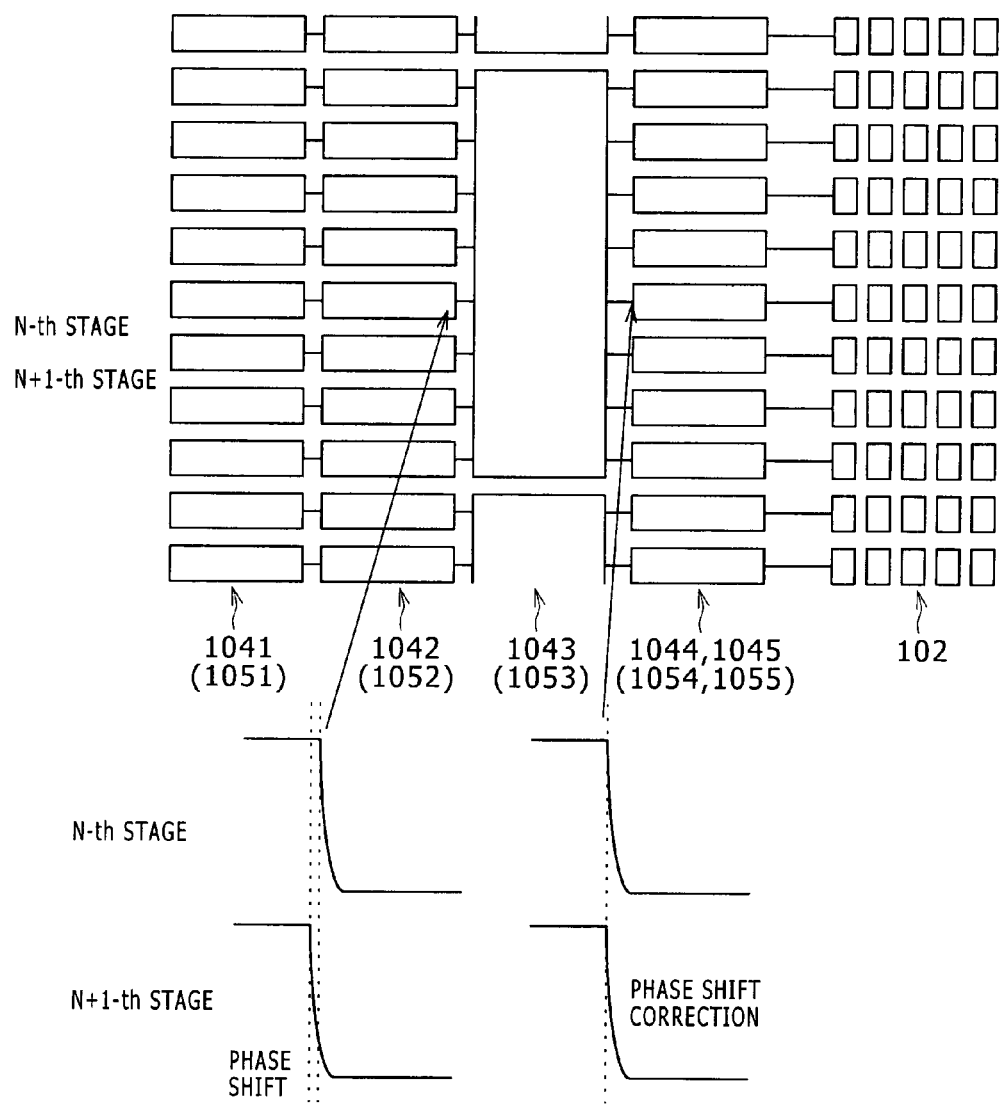
FIG. 17 is a diagram for explaining a function of an enable pulse buffer part in the write scanner and the drive scanner.

As shown in FIG. 17, the enable pulse buffer parts 1043 and 1053 in the write scanner 104 and the drive scanner 105 correct the phase shift of the pulses between the clock pulse buffer parts 1042 and 1052 and the logic parts 1044 and 1054.

The active-matrix organic EL display panel 100A is fabricated by integrating drive circuits employing p-Si•TFTs over a glass substrate by using a low-temperature process.

The low-temperature poly-Si•TFT has combined advantages of all of an a-Si•TFT, high-temperature poly-Si•TFT, and single-crystal Si•FET. Furthermore, the low-temperature poly-Si•TFT can realize a narrow frame, high definition, small thickness, and small weight.

The p-Si is formed by employing ELA (excimer laser anneal) to irradiate an a-Si film with high-power excimer laser pulses (with a wavelength of 308 nm) to thereby subject the a-Si film to melting, cooling, and solidification. By thus employing the ELA, high-quality p-Si can be achieved across a large area at a low temperature.

The output power of an excimer laser varies along the scan direction.

Therefore, in the present embodiment, in order to prevent the occurrence of streaks and visual recognition of the boundaries as colored ones due to differences in transistor characteristics such as the threshold voltage and mobility among drive transistors in the buffers on the respective stages in the vertical scanners 104 to 107, panel fabrication is carried out with use of the ELA by using the following first or second method basically.

First method: in an ELA crystallization step for an active-matrix organic EL display, the vertical scan direction of an excimer laser is set parallel to the direction of the L-length (channel length) of transistors (current flow direction) included in buffers in a vertical scanner.

Second method: in an ELA crystallization step for an active-matrix organic EL display, the scan direction of an excimer laser is set perpendicular to the arrangement direction of transistors (TFTs) of a buffer group in a vertical scanner.

In the following description, a vertical scanner is given numeral 200.

Initially the first method will be described below.

Figure 18:
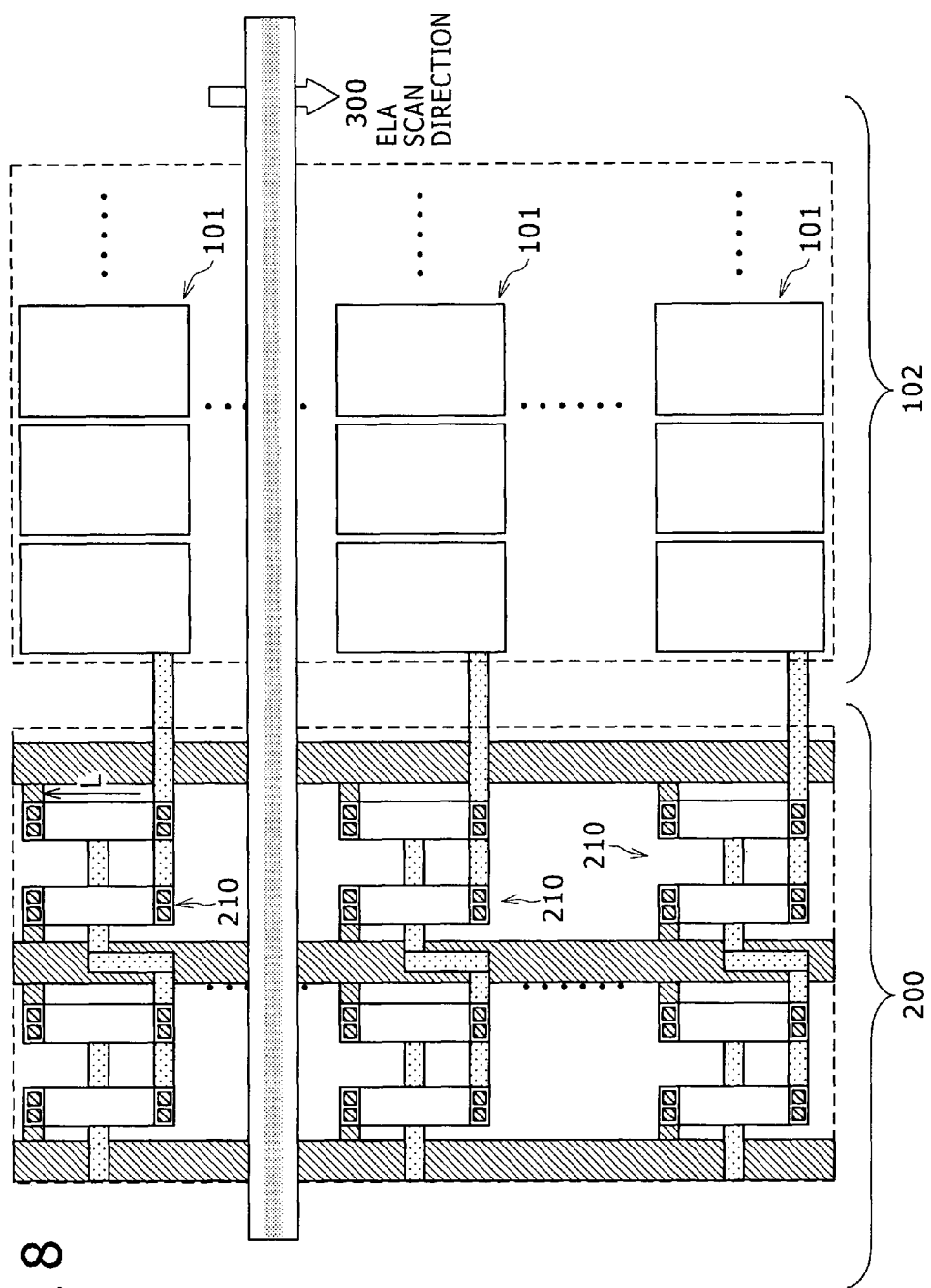
FIG. 18 is a diagram for explaining a first example of a first method applied to an ELA crystallization step for an active-matrix organic EL display.

FIG. 18 is a diagram for explaining a first example of the first method applied to an ELA crystallization step for an active-matrix organic EL display.

In the first example of the first method, as shown in FIG. 18, in an ELA crystallization step for an active-matrix organic EL display 100, the scan direction 300 of an excimer laser is set parallel to the L-length direction (current flow direction) of transistors (TFTs) 210 included in buffers in a vertical scanner 200.

In the first example of FIG. 18, the TFTs 210 of the buffers in the vertical scanner 200 are formed in such a way that the L-length direction thereof is parallel to the downward direction in FIG. 18.

In other words, the TFTs 210 of the buffers in the vertical scanner 200 are formed in such a way that the L-length direction thereof is set parallel to the extension direction of data lines DTL disposed in a pixel array part 102 (set parallel to a direction different from the extension direction of scan lines WSL, drive lines DSL, and auto-zero lines AZL1 and AZL2, such as the direction perpendicular to these lines).

The plural TFTs 210 of the buffers in the vertical scanner 200 are formed on a straight line in such a manner as to form a row along the L-length direction of the TFTs 210 (in parallel to the scan direction). That is, the plural TFTs 210 are arranged in a matrix with the L-length direction thereof set parallel to the scan direction.

Furthermore, the scanning with the excimer laser is carried out along the L-length direction of the TFTs 210, i.e., along the downward direction in the drawing.

Figure 19:
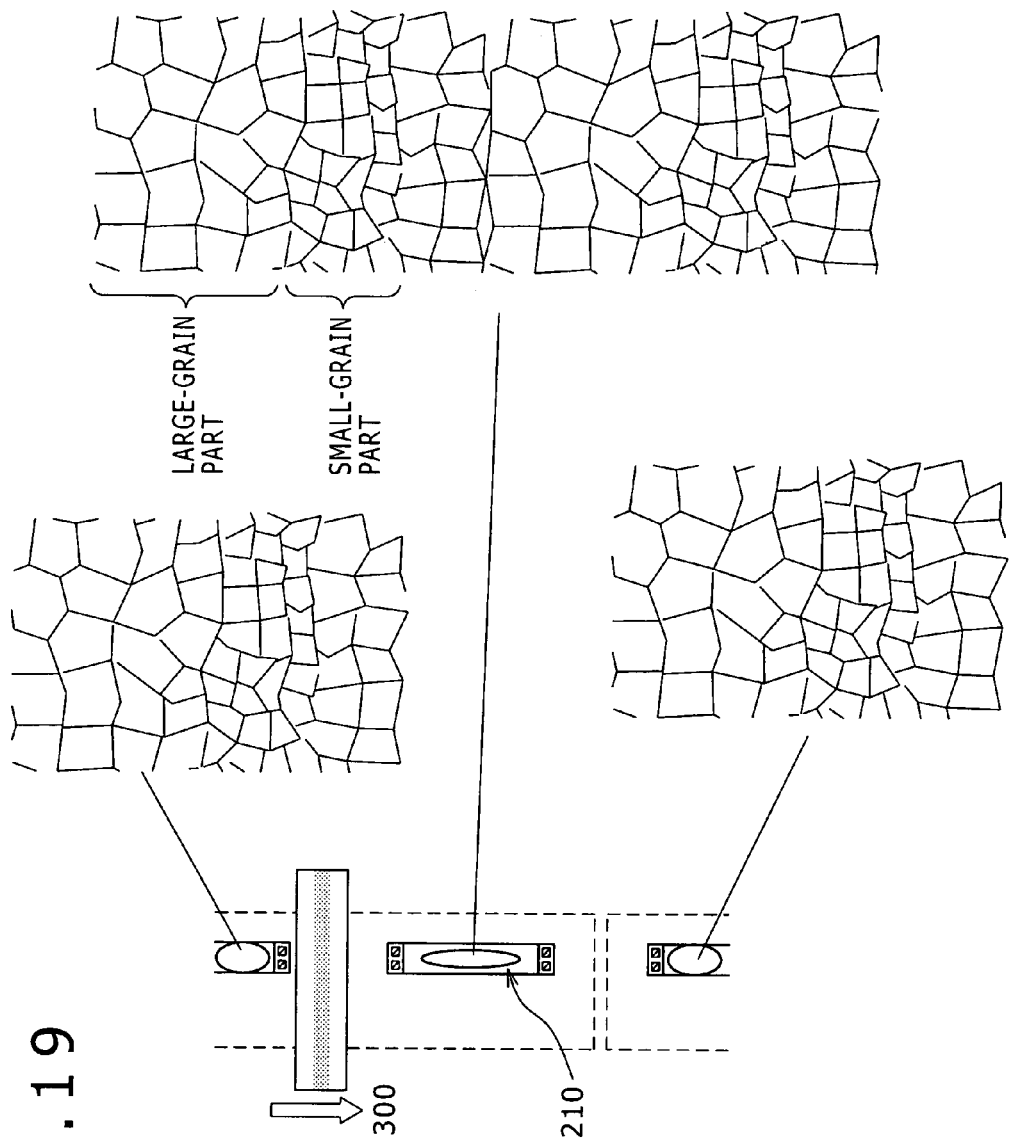
FIG. 19 is a diagram showing an image of a crystalline structure obtained when the first example of the first method is employed for an ELA crystallization step.

FIG. 19 is a diagram showing an image of the crystalline structure obtained when the first example of the first method is employed for the ELA crystallization step.

Due to variation in the output power of the excimer laser, the size of generated crystal grains varies. However, the size of the crystal grains varies along the L-length direction of the TFTs (transistors) 210, i.e., along the direction of the current flow path. Therefore, the variation in each drive transistor is averaged, and thus differences in characteristics are small.

In the above-described example, the L-length direction of the TFTs 210 in all the buffers in the vertical scanner 200 is set parallel to the scan direction. Alternatively, the L-length direction of only the TFTs 210 in the final-stage buffers in the vertical scanner 200 may be set parallel to the scan direction of the excimer laser.

Furthermore, when enable pulses are used for operation in which high accuracy of timings is demanded, such as mobility correction and threshold voltage cancel, the L-length direction of only the TFTs (transistors) 210 in the enable pulse buffer part (the enable pulse buffer parts 1043 and 1053 in FIGS. 16 and 17) that outputs the enable pulses may be set parallel to the scan direction 300 of an excimer laser.

Figure 20:
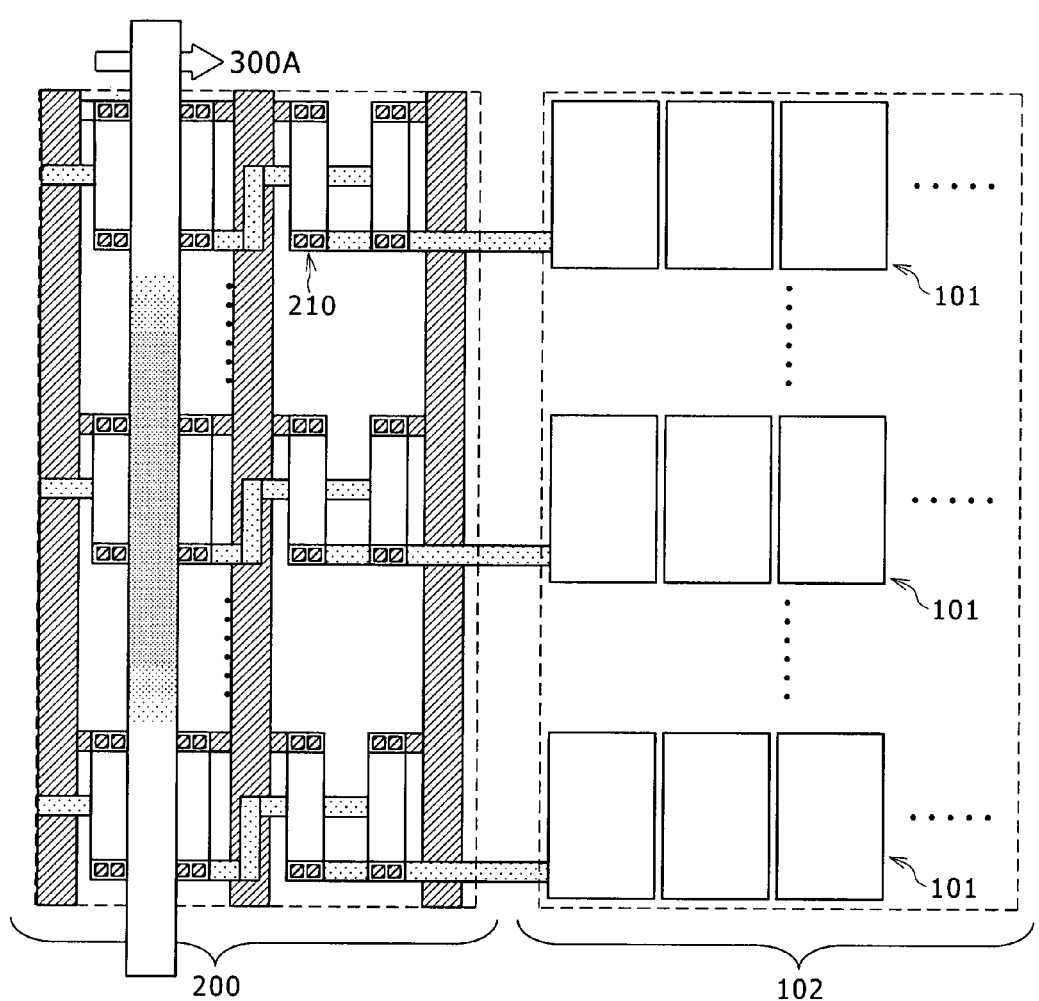
FIG. 20 is a diagram for explaining a second example of the first method applied to an ELA crystallization step for an active-matrix organic EL display.

FIG. 20 is a diagram for explaining a second example of the first method applied to an ELA crystallization step for an active-matrix organic EL display.

In the second example of the first method, as shown in FIG. 20, similarly to the first example of FIG. 18, TFTs 210 in a vertical scanner 200 are formed in such a way that the L-length direction thereof is set parallel to the extension direction of data lines DTL disposed in a pixel array part 102 (set parallel to a direction different from the extension direction of scan lines WSL, drive lines DSL, and auto-zero lines AZL1 and AZL2, such as the direction perpendicular to these lines). However, in the second example, in an ELA crystallization step for an active-matrix organic EL display 100, the scan direction 300A of an excimer laser is set perpendicular to the L-length direction (current flow direction) of the transistors (TFTs) 210 included in buffers in the vertical scanner 200.

Figure 21:
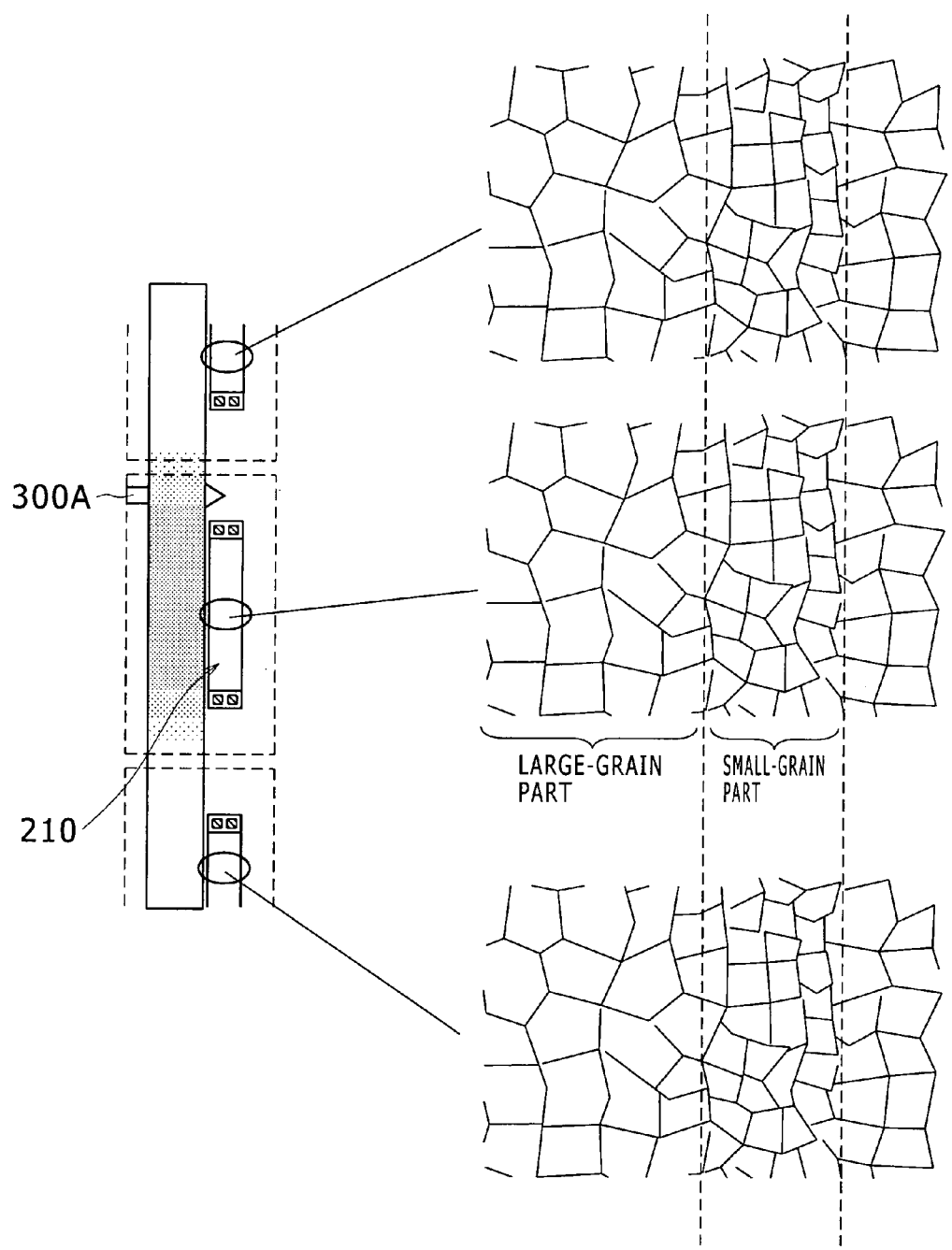
FIG. 21 is a diagram showing an image of a crystalline structure obtained when the second example of the first method is employed for an ELA crystallization step.

FIG. 21 is a diagram showing an image of the crystalline structure obtained when the second example of the first method is employed for the ELA crystallization step.

Due to variation in the output power of the excimer laser, the size of generated crystal grains varies. However, the TFTs (transistors) 210 are formed in such a manner as to form a row, and thus the size of the crystal grains varies in similar regions in each of the TFTs (transistors) 210. Therefore, the differences in characteristics in the whole of the buffer are small.

The first method can suppress the occurrence of streaks attributed to differences in characteristics of transistors in a vertical scanner due to scanning with an excimer laser in an ELA crystallization step for an active-matrix organic EL display.

The second method will be described below.

Figure 22:
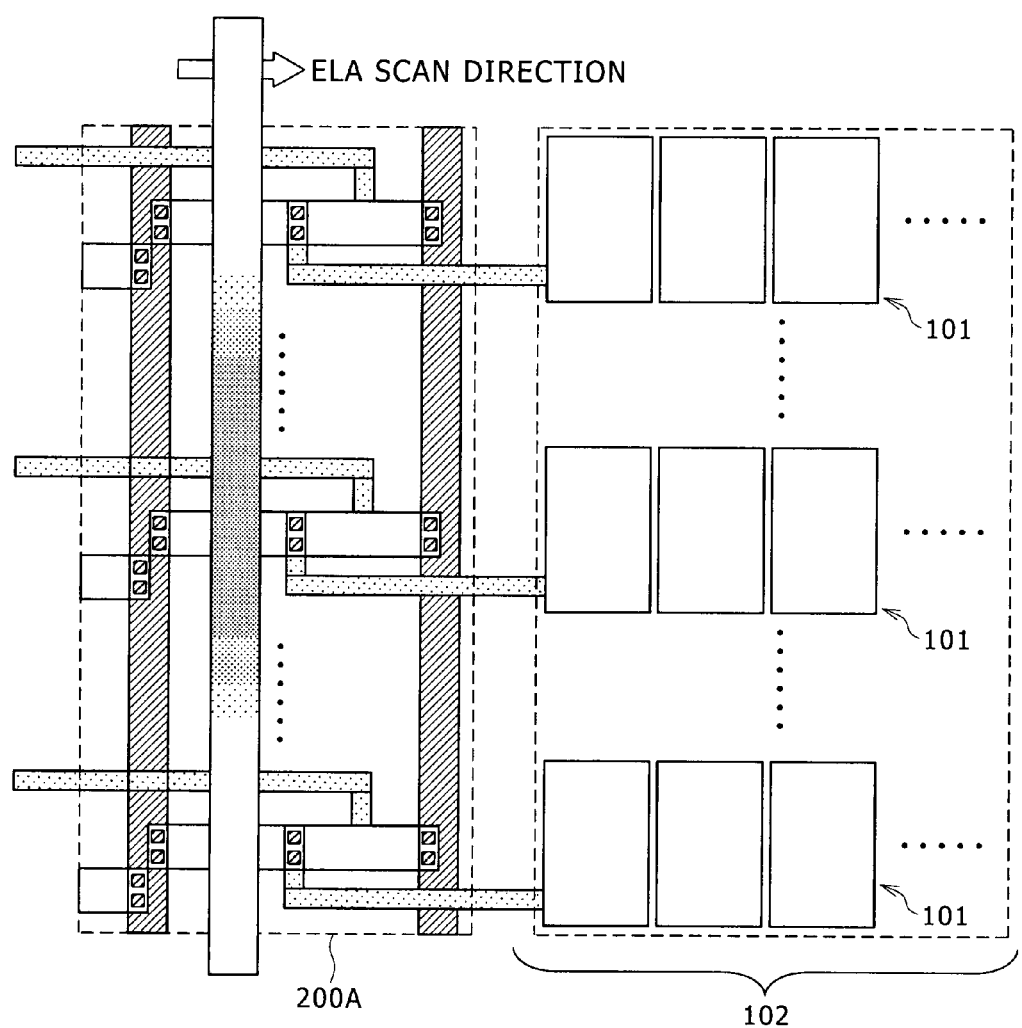
FIG. 22 is a diagram for explaining a second method applied to an ELA crystallization step for an active-matrix organic EL display.

FIG. 22 is a diagram for explaining the second method applied to an ELA crystallization step for an active-matrix organic EL display.

In the second method, as shown in FIG. 22, in an ELA crystallization step for an active-matrix organic EL display 100, the scan direction 300 of an excimer laser is set perpendicular to the L-length direction (current flow direction) of transistors (TFTs) 210 included in a buffer group in a vertical scanner 200A.

In the example of FIG. 22, the TFTs 210 of the buffers in the vertical scanner 200A are formed in such a way that the L-length direction thereof is parallel to the lateral direction in FIG. 22.

In other words, the TFTs 210 of the buffers in the vertical scanner 200A are formed in such a way that the L-length direction thereof is set perpendicular to the extension direction of data lines DTL disposed in a pixel array part 102 (set parallel to the extension direction of scan lines WSL, drive lines DSL, and auto-zero lines AZL1 and AZL2).

The plural TFTs 210 of the buffers in the vertical scanner 200A are formed on a straight line in such a manner as to form a row along the L-length direction of the TFTs 210 (in parallel to the scan direction). That is, the plural TFTs 210 are arranged in a matrix with the L-length direction thereof set parallel to the scan direction.

Furthermore, the scanning with the excimer laser is carried out along the L-length direction of the TFTs 210, i.e., along the direction from the left to the right in the drawing.

Figure 23:
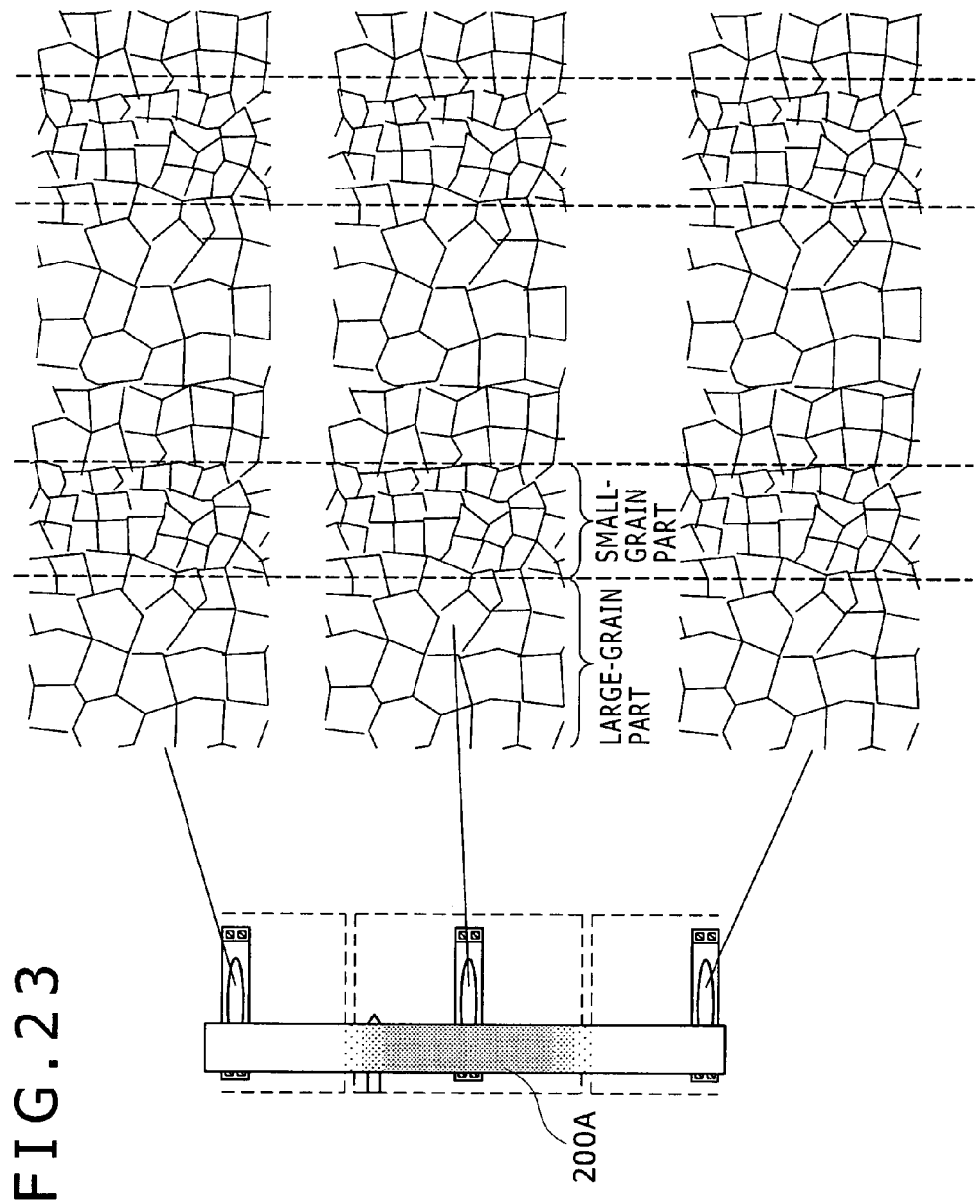
FIG. 23 is a diagram showing an image of a crystalline structure obtained when the second method is employed for an ELA crystallization step.

FIG. 23 is a diagram showing an image of the crystalline structure obtained when the second method is employed for the ELA crystallization step.

Due to variation in the output power of the excimer laser along the scan direction 300A, the size of generated crystal grains varies. However, the buffer transistors on the respective stages are irradiated with the high-power excimer laser pulses in a similar manner, and thus the differences in characteristics among the transistors are small.

Also in the above-described example of the second method, the L-length direction of the TFTs 210 in all the buffers in the vertical scanner 200A is set parallel to the scan direction. Alternatively, the L-length direction of only the TFTs 210 in the final-stage buffers in the vertical scanner 200A may be set parallel to the scan direction of the excimer laser.

The TFTs 210 of the buffers on the respective stages (rows) corresponding to the pixel arrangement are formed in such a manner as to form a row along the direction perpendicular to the L-length direction.

Furthermore, when enable pulses are used for operation in which high accuracy of timings is demanded, such as mobility correction and threshold voltage cancel, the L-length direction of only the TFTs (transistors) 210 in the enable pulse buffer part (the enable pulse buffer parts 1043 and 1053 in FIGS. 16 and 17) that outputs the enable pulses may be set parallel to the scan direction 300 of an excimer laser.

The TFTs 210 of the buffers in the enable pulse buffer part on the respective stages corresponding to the pixel arrangement are formed in such a manner as to form a row along the direction perpendicular to the L-length direction.

The second method can suppress the occurrence of streaks attributed to differences in characteristics of transistors in a vertical scanner due to scanning with an excimer laser in an ELA crystallization step for an active-matrix organic EL display.

As described above, the output power of an excimer laser varies along the scan direction.

Therefore, in the present embodiment, in order to prevent the boundaries between columns of pixels arranged in a stripe from being visually recognized as streaks and prevent the boundaries from being visually recognized as colored ones, panel fabrication is carried out with use of the ELA by using the following first or second method basically.

First method: in an ELA crystallization step for an active-matrix organic EL display, the scan direction of a laser beam is set parallel to the arrangement direction of R pixels, G pixels, and B pixels arranged in a stripe.

Second method: the kinds of L-length directions of transistors (TFTs) in an active-matrix organic EL display include both the direction parallel to the scan direction of a laser beam in an ELA crystallization step and the direction perpendicular thereto.

Initially the first method will be described below.

Figure 24:
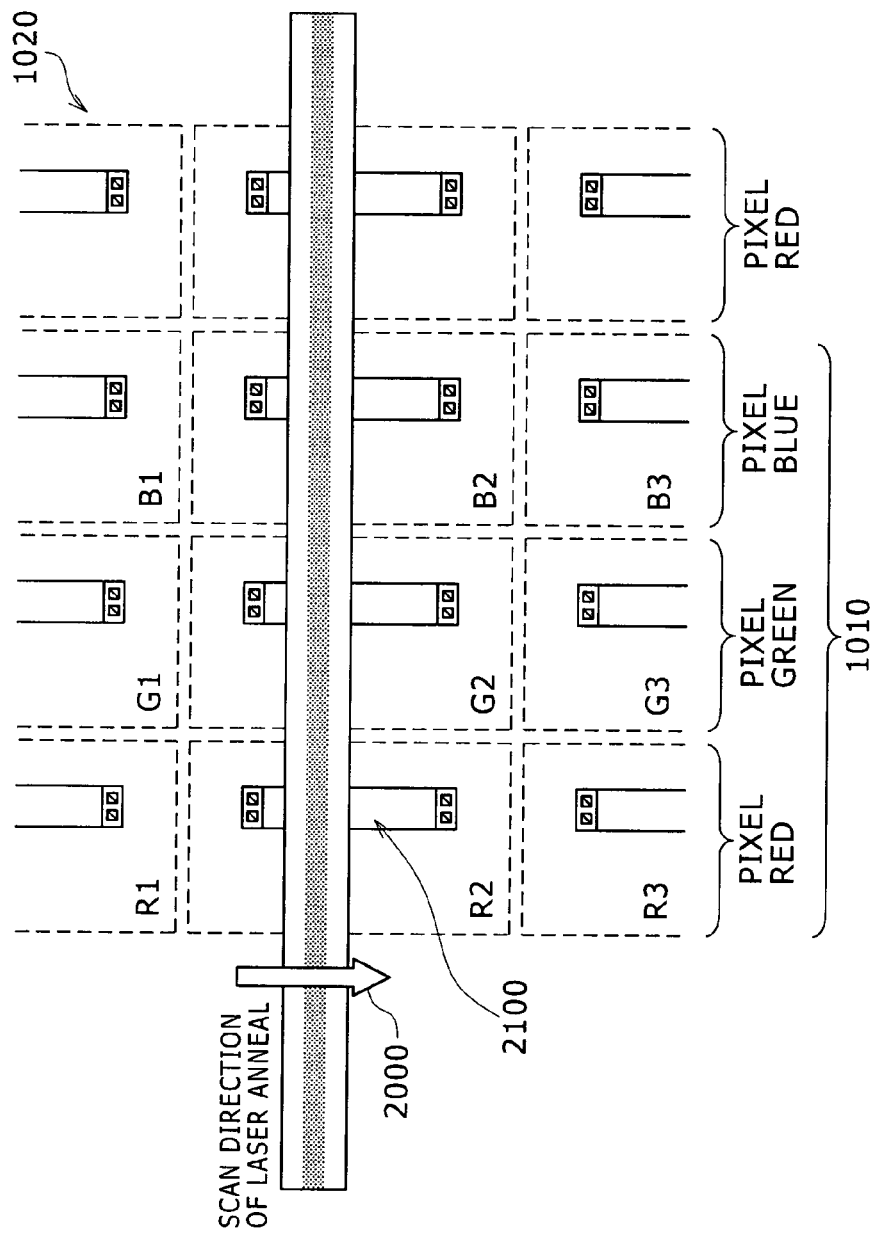
FIG. 24 is a diagram for explaining a first example of a first method applied to an ELA crystallization step for an active-matrix organic EL display.

FIG. 24 is a diagram for explaining a first example of the first method applied to an ELA crystallization step for an active-matrix organic EL display.

In the first example of the first method, as shown in FIG. 24, in an ELA crystallization step for an active-matrix organic EL display 100, the scan direction 2000 of an excimer laser is set parallel to the L-length direction (current flow direction) of transistors (TFTs) 2100 included in pixels.

Figure 25:
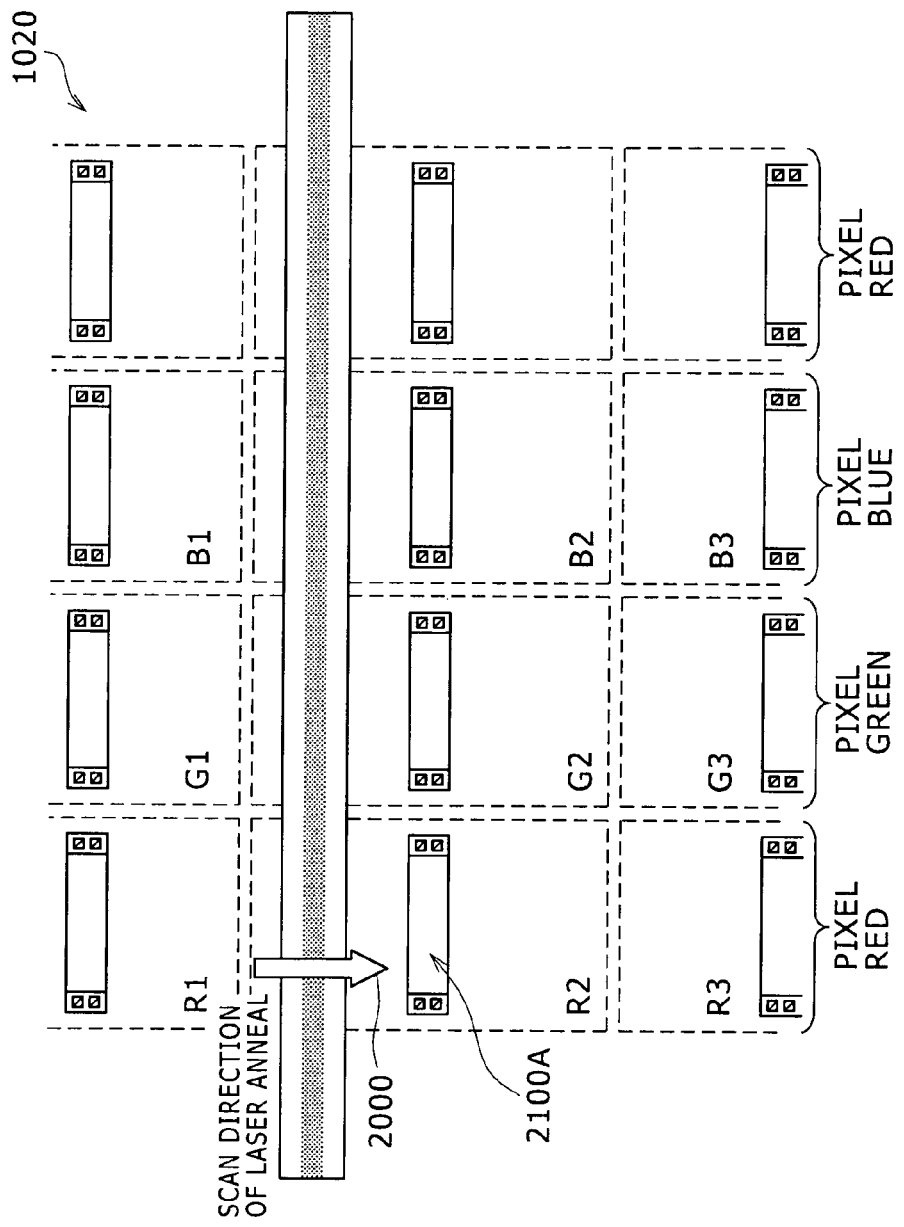
FIG. 25 is a diagram for explaining a second example of the first method applied to an ELA crystallization step for an active-matrix organic EL display.

FIG. 25 is a diagram for explaining a second example of the first method applied to an ELA crystallization step for an active-matrix organic EL display.

In the second example of the first method, as shown in FIG. 25, in an ELA crystallization step for an active-matrix organic EL display 100, the scan direction 2000 of an excimer laser is set perpendicular to the L-length direction (current flow direction) of transistors (TFTs) 2100A included in pixels.

That is, in the first method, the scan direction of an excimer laser is set parallel to the arrangement direction of R pixels, G pixels, and B pixels, irrespective of the L-length direction of TFTs 2100 and 2100A included in the pixels.

Because the output power of an excimer laser varies along the-scan direction, differences in transistor characteristics arise among the TFTs 2100 and 2100A arranged along the scan direction, i.e., among the TFTs 2100 and 2100A on a column of the same color, such as the TFTs 2100 and 2100A in the pixels R1, R2, and R3 in FIGS. 24 and 25.

However, these differences are hardly recognized visually because the differences are among drive transistors of the same color.

Therefore, the first method can suppress the occurrence of streaks visually recognized at the boundaries between columns of R, G and B.

The second method will be described below.

When the method in which the scan direction 2000 of an excimer laser is set parallel to the L-length direction of the TFTs 2100 in the pixels as shown in FIG. 24 is employed, a difference in transistor characteristics will arise between the row of the pixels R2, G2, and B2 and the row of the pixels R3, G3, and B3 in FIG. 24 for example, so that streaks and unevenness will be visually recognized at the boundary between the rows.

In the second method, in order to address this problem, the kinds of L-length directions of transistors (TFTs) in an active-matrix organic EL display include both the direction parallel to the scan direction of a laser beam in an ELA crystallization step and the direction perpendicular thereto.

Figure 26:
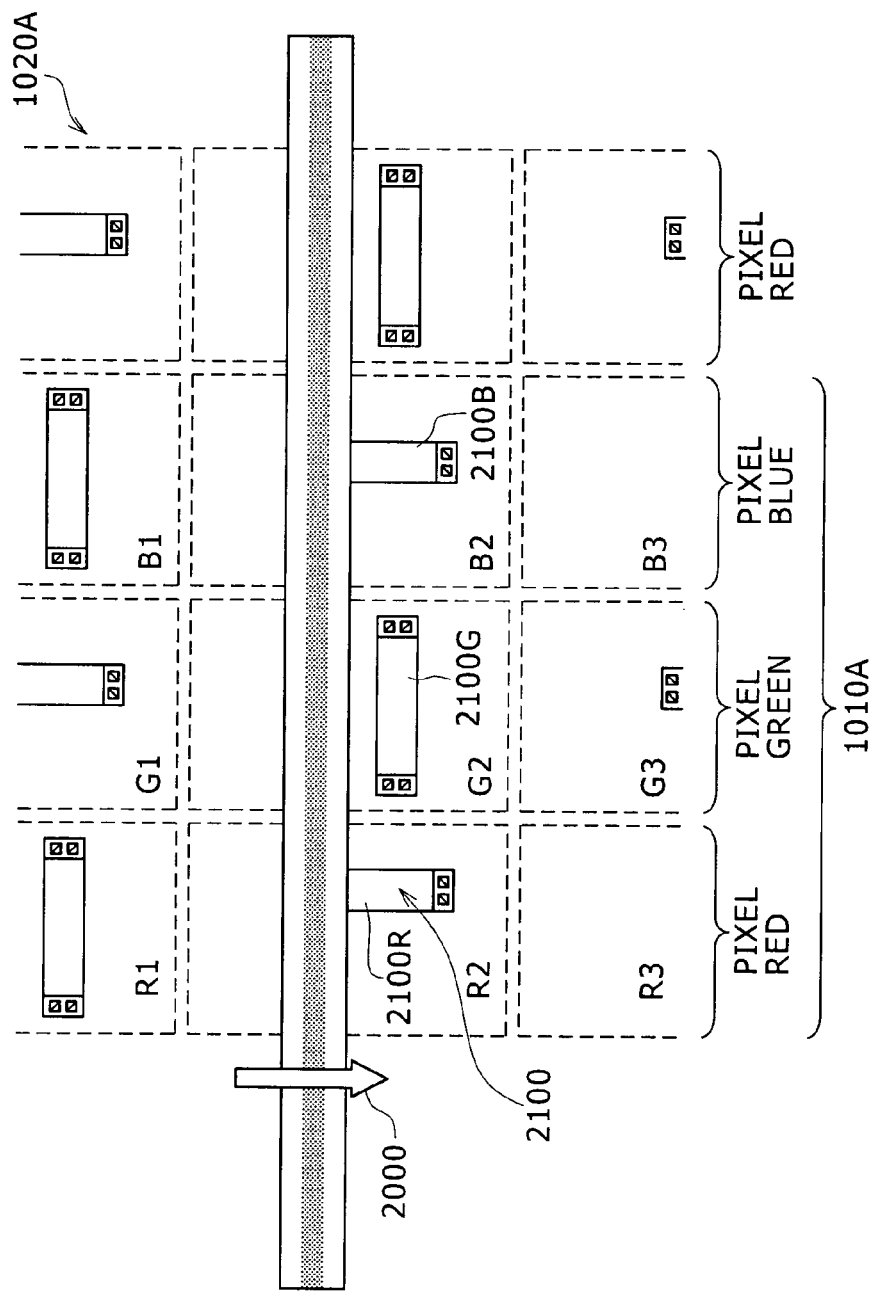
FIG. 26 is a diagram for explaining a first example of a second method applied to an ELA crystallization step for an active-matrix organic EL display.

FIG. 26 is a diagram for explaining a first example of the second method applied to an ELA crystallization step for an active-matrix organic EL display.

In the first example of the second method, as shown in FIG. 26, the L-length directions of TFTs 2100 in pixels are made different from each other between adjacent subpixels.

Referring to FIG. 26, the L-length direction of the TFT 2100 in the subpixel G2 is set parallel to the horizontal direction, while the L-length direction of the TFTs 2100 in the adjacent subpixels R2, G1, G3, and B2 is set parallel to the vertical direction.

In other words, the TFTs 2100 included in the respective pixel circuits 101 are formed in such a way that the following two kinds of subpixels are arranged with a regular cycle: subpixels in which the L-length direction is set parallel to the extension direction of data lines DTL disposed in a pixel array part 1020A (set parallel to a direction different from the extension direction of scan lines WSL, drive lines DSL, and auto-zero lines AZL1 and AZL2, such as the direction perpendicular to these lines); and subpixels in which the L-length direction is set perpendicular to the extension direction of the data lines DTL disposed in the pixel array part 1020A (set parallel to the extension direction of the scan lines WSL, the drive lines DSL, and the auto-zero lines AZL1 and AZL2).

The scanning with an excimer laser is carried out along the downward direction in the drawing, for example.

Such an arrangement involves variation in characteristics among adjacent transistors. However, the variation is not focused along the column or row direction, and thus streaks and unevenness are unnoticeable.

Figure 27:
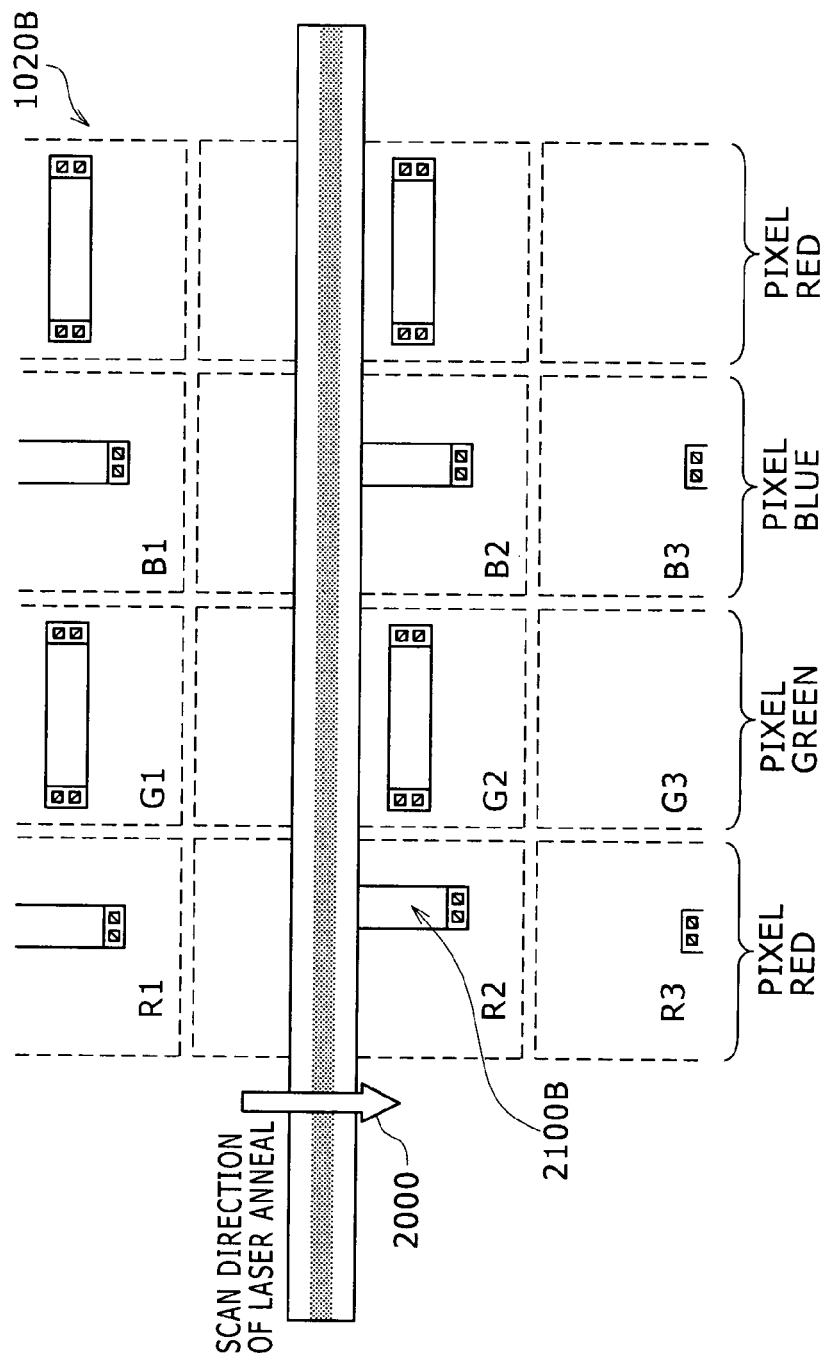
FIG. 27 is a diagram for explaining a second example of the second method applied to an ELA crystallization step for an active-matrix organic EL display.

FIG. 27 is a diagram for explaining a second example of the second method applied to an ELA crystallization step for an active-matrix organic EL display.

In the second example of the second method, as shown in FIG. 27, TFTs (transistors) 2100B in pixels are arranged in such a way that the L-length directions of the TFTs 2100B in the pixels are different from each other between adjacent RGB subpixels.

Also in this case, variation is not focused along the column or row direction but dispersed, and thus streaks and unevenness are unnoticeable.

Figure 28:
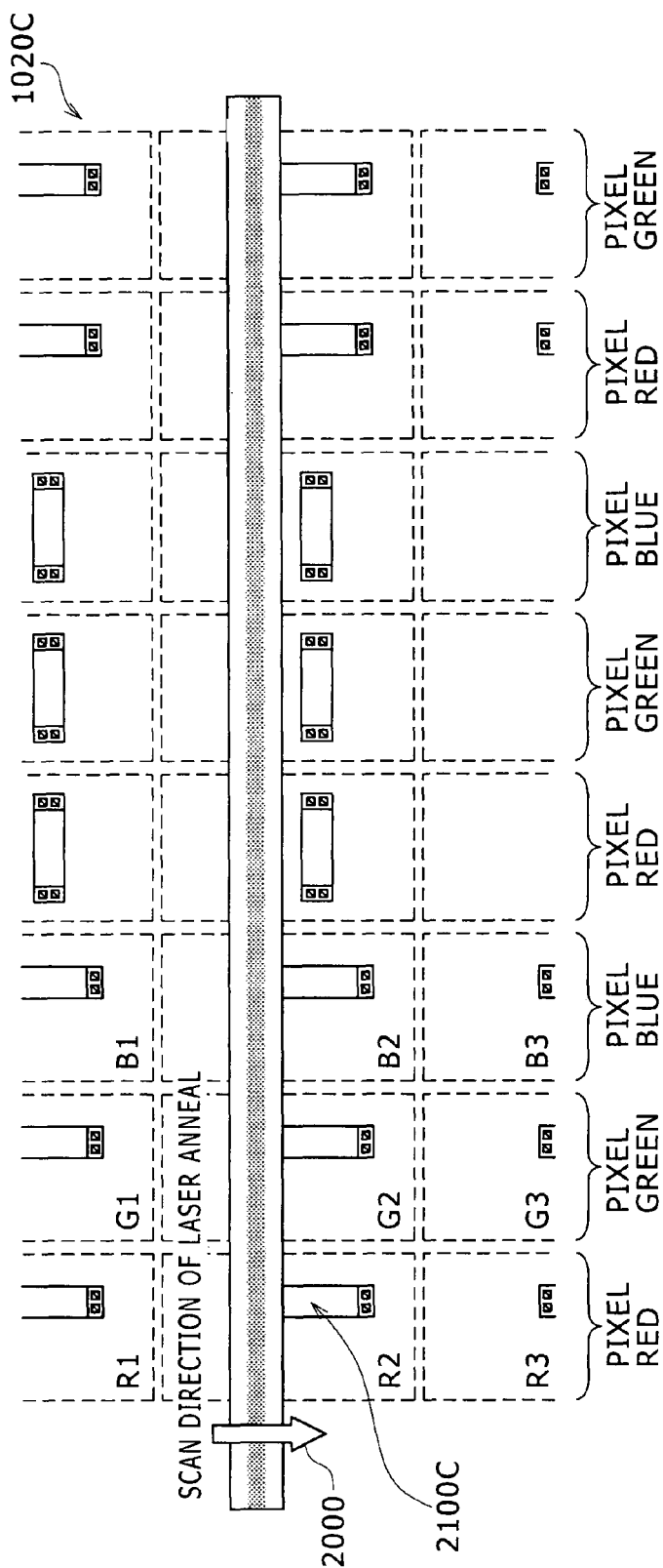
FIG. 28 is a diagram for explaining a third example of the second method applied to an ELA crystallization step for an active-matrix organic EL display.

FIG. 28 is a diagram for explaining a third example of the second method applied to an ELA crystallization step for an active-matrix organic EL display.

In the third example of the second method, as shown in FIG. 28, the L-length directions of TFTs 2100C in pixels are made different from each other between adjacent pixels.

Also in this case, variation is not focused along the column or row direction but dispersed, and thus streaks and unevenness are unnoticeable.

In the above-described examples, the placement directions (L-length directions) of the TFTs (transistors) 2100 in pixels are set to the horizontal and vertical directions. Alternatively, the placement directions may be set to any direction.

It is desirable that in an ELA crystallization step, the scan direction of an excimer laser be set perpendicular to the direction along which RGB subpixels are alternately arranged. This is to reduce coloring, streaks and unevenness due to differences in the color among R, G, and B across the respective boundaries.

Therefore, the second method can suppress the occurrence of streaks and coloring attributed to differences in characteristics of TFTs (transistors) in pixels.

The above-described first and second methods can be applied also to a pixel arrangement other than the above-described arrangements.

Figure 29:
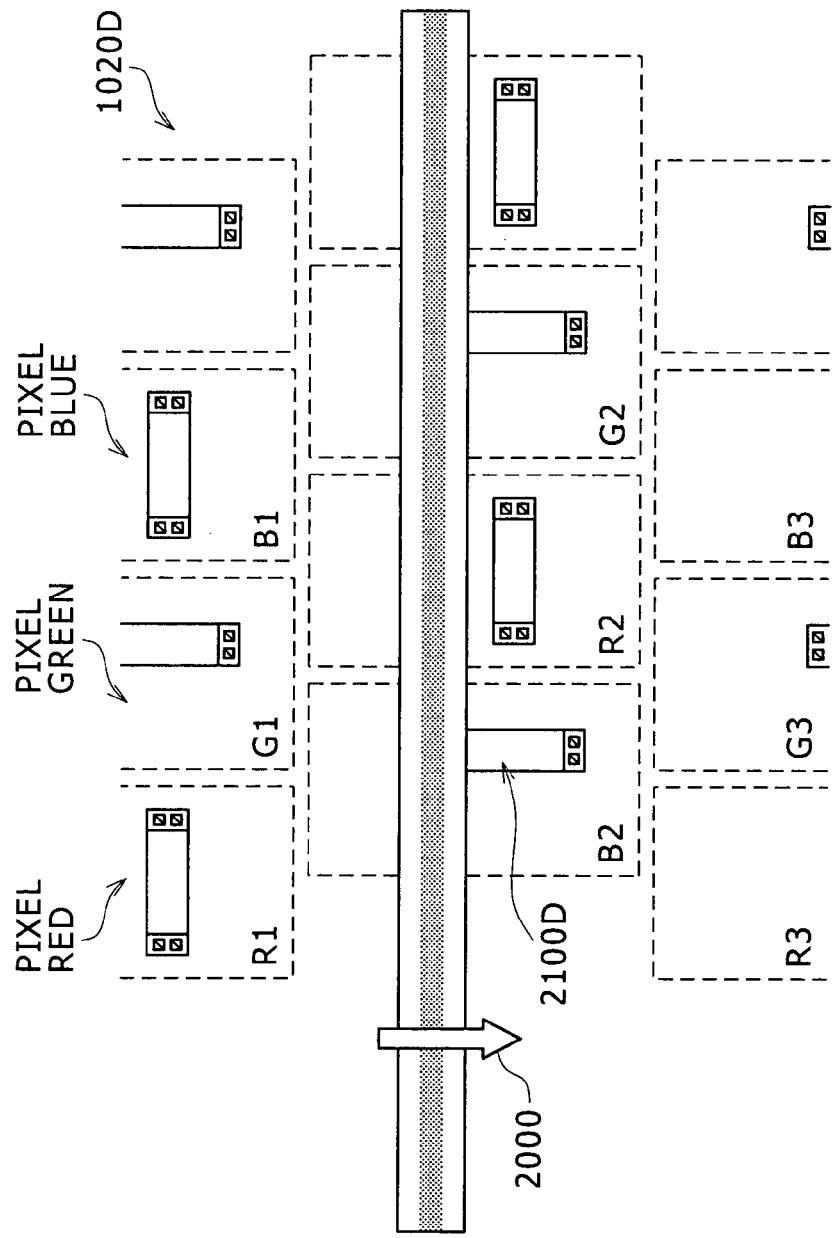
FIG. 29 is a diagram showing an example in which the first example of the second method is applied to a delta arrangement of an active-matrix organic EL display.
Figure 30:
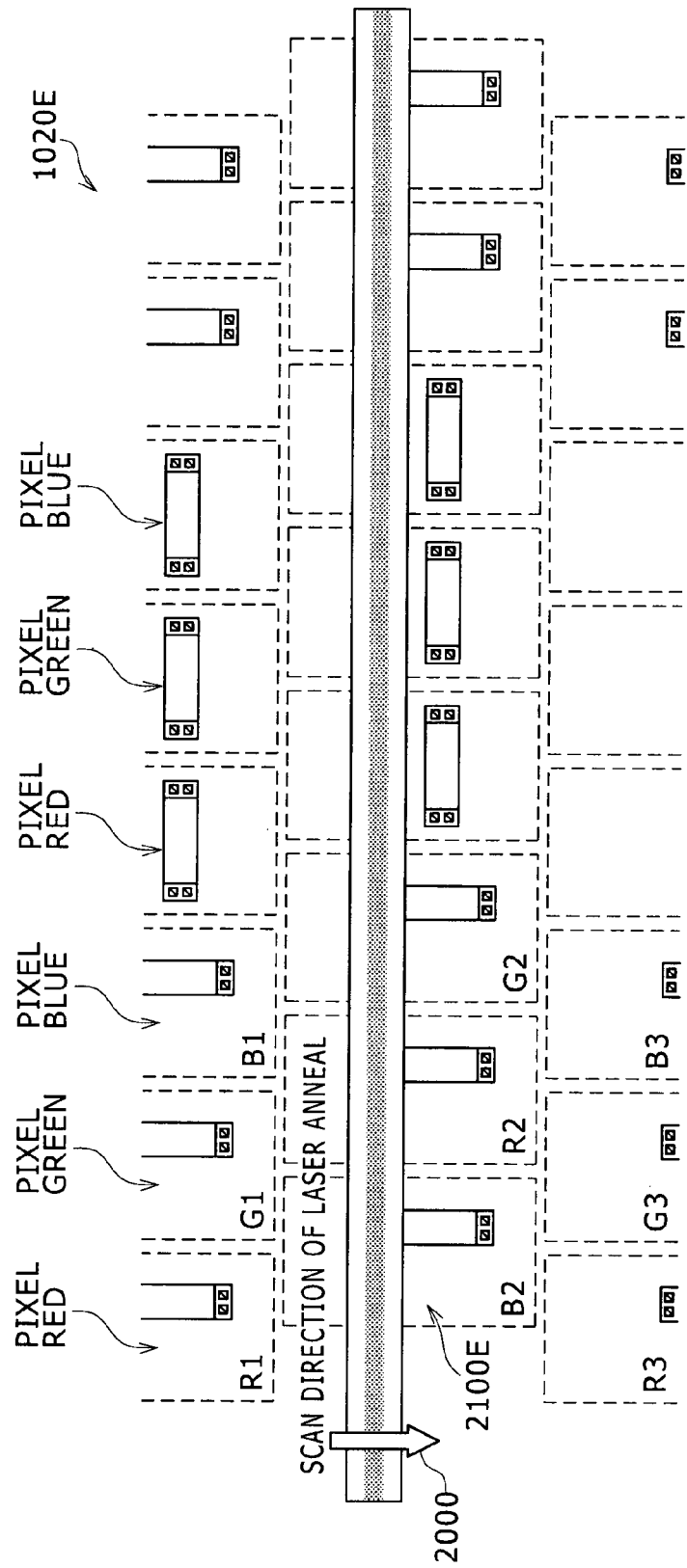
FIG. 30 is a diagram showing an example in which the third example of the second method is applied to a delta arrangement of an active-matrix organic EL display.

For example, as shown in FIGS. 29 and 30, the methods can be applied to a so-called delta arrangement and can offer the same advantages.

To a pixel array part 1020D with a delta arrangement in FIG. 29, the first example of the second method shown in FIG. 26 is applied.

Furthermore, to a pixel array part 1020D with a delta arrangement in FIG. 30, the third example of the second method shown in FIG. 28 is applied.

Also in these cases, variation is not focused along the column or row direction but dispersed, and thus streaks and unevenness are unnoticeable.

Therefore, the occurrence of streaks and coloring attributed to differences in characteristics of TFTs (transistors) in pixels can be suppressed.

Employing the first and second methods can suppress the occurrence of streaks and coloring attributed to differences in characteristics of transistors in pixels dependent upon scanning with an excimer laser and the arrangement direction of the transistors in the pixels in an ELA crystallization step for an active-matrix organic EL display.

The operation of the above-described configurations will be described below with a focus on the operation of a pixel circuit in association with FIGS. 31A to 31F.

FIG. 31A shows a drive signal DS applied to the drive line DSL, and FIG. 31B shows a drive signal WS applied to the scan line WSL. FIG. 31C shows a drive signal AZ1 applied to the first auto-zero line AZL1, and FIG. 31D shows a drive signal AZ2 applied to the second auto-zero line AZL2. FIG. 31E shows the potential at the second node ND112, and FIG. 31F shows the potential at the first node ND111.

Initially, the drive signal DS applied to the drive line DSL by the drive scanner 105 is kept at the high level, and the drive signal WS applied to the scan line WSL by the write scanner 104 is kept at the low level. Furthermore, the drive signal AZ1 applied to the auto-zero line AZL1 by the auto-zero circuit 106 is kept at the low level, and the drive signal AZ2 applied to the auto-zero line AZL2 by the auto-zero circuit 107 is kept at the high level.

As a result, the TFT 113 is turned on. At this time, a current flows via the TFT 113, so that the source potential Vs of the TFT 112 (potential at the node ND111) falls down to VSS2. Thus, the voltage applied to the EL light-emitting element 116 becomes zero, and hence the EL light-emitting element 116 does not emit light.

In this state, even when the TFT 114 is turned on, the voltage held by the capacitor C111, i.e., the gate voltage of the TFT 112, does not change.

Subsequently, as shown in FIGS. 31C and 31D, in the period during which the EL light-emitting element 116 does not emit light, the drive signal AZ1 to the auto-zero line AZL1 is turned to the high level with the drive signal AZ2 to the auto-zero line AZL2 kept at the high level. This changes the potential at the second node ND112 to VSS1.

Subsequently, the drive signal AZ2 to the auto-zero line AZL2 is switched to the low level, and then the drive signal DS applied to the drive line DSL by the drive scanner 105 is switched to the low level during a predetermined period.

Thus, the TFT 113 is turned off, while the TFTs 115 and 111 are turned on. This causes a current to flow through the path of the TFTs 112 and 111, which raises the potential at the first node.

Subsequently, the drive signal DS applied to the drive line DSL by the drive scanner 105 is switched to the high level, and the drive signal AZ1 is switched to the low level.

As the result of the above-described operation, the threshold voltage Vth of the drive transistor 112 is corrected, so that the potential difference between the second node ND112 and the first node ND111 becomes Vth.

In this state, after the elapse of a predetermined period, the drive signal WS applied to the scan line WSL by the write scanner 104 is kept at the high level during a predetermined period, so that data is written to the node ND112 via the data line. Furthermore, in the period during which the drive signal WS is at the high level, the drive signal DS applied to the drive line DSL by the drive scanner 105 is switched to the low level, and then the drive signal WS is switched to the low level.

At this time, the TFT 111 is turned on, and the TFT 114 is turned off, so that mobility correction is carried out.

In this case, the voltage between the gate and source of the TFT 112 is constant because the TFT 114 is in the off-state. Therefore, the TFT 112 applies a constant current Ids to the EL light-emitting element 116. This raises the potential at the first node ND111 to a voltage Vx that causes the current Ids to flow through the EL light-emitting element 116, so that the EL light-emitting element 116 emits light.

Also in the present circuit, the current-voltage (I-V) characteristic of the EL element changes as the total emission time thereof becomes longer. Therefore, the potential at the first node ND111 also changes. However, because the voltage Vgs between the gate and source of the TFT 112 is kept at a constant value, the current flowing through the EL light-emitting element 116 does not change. Therefore, even when the I-V characteristic of the EL light-emitting element 116 deteriorates, the constant current Ids invariably continues to flow, and hence the luminance of the EL light-emitting element 116 does not change.

For the thus driven display, it is possible to suppress the occurrence of streaks attributed to differences in characteristics of transistors in a vertical scanner due to scanning with an excimer laser in an ELA crystallization step for an active-matrix organic EL display. Thus, high-quality images can be achieved.

Furthermore, for the thus driven display, it is possible to suppress the occurrence of streaks and coloring attributed to differences in characteristics of transistors in pixels dependent upon scanning with an excimer laser and the arrangement direction of the transistors in the pixels in an ELA crystallization step for an active-matrix organic EL display. Thus, high-quality images can be achieved.

It should be understood by those skilled in the art that various modifications, combinations, sub-combinations and alterations may occur depending on design requirements and other factor in so far as they are within the scope of the appended claims or the equivalents thereof.

What is claimed is:

1. A display comprising:
a pixel array part that includes a plurality of pixel circuits that are arranged in a matrix form in columns and rows, each of the plurality of pixel circuits having a transistor whose conduction state is controlled by a drive signal received at a control terminal of the transistor; and
a scanner configured to have output stages that are arranged in a column direction and that each are configured to output the drive signal to a corresponding row of the plurality of pixel circuits,
wherein each of the output stages includes a given buffer that comprises transistors that have a channel length extending in the column direction and that are formed through irradiation with laser light that is moved for scanning in the column direction.

2. The display of claim 1,
wherein those transistors of the given buffer of the output stages that have a channel length extending in the column direction and that are formed through irradiation with laser light that is moved for scanning in the column direction are arranged in one or more columns in which the transistors thereof are aligned with respect to each other in the column direction.

3. The display of claim 1,
wherein each of the given buffer is a final-stage buffer.

4. The display of claim 3,
wherein those transistors of the given buffer of the output stages that have a channel length extending in the column direction and that are formed through irradiation with laser light that is moved for scanning in the column direction are arranged in one or more columns in which the transistors thereof are aligned with respect to each other in the column direction.

5. The display of claim 1,
wherein the given buffer constitute an enable pulse buffer that generates an enable pulse of which phase has been corrected.

6. The display of claim 5,
wherein those transistors of the given buffer of the output stages that have a channel length extending in the column direction and that are formed through irradiation with laser light that is moved for scanning in the column direction are arranged in one or more columns in which the transistors thereof are aligned with respect to each other in the column direction.

7. The display of claim 1,
wherein the transistor of each of the plurality of pixel circuits is formed through irradiation with laser light that is moved for scanning in the column direction, and
the plurality of pixel circuits are arranged such that each column of the plurality of pixel circuits includes only ones of the plurality of pixel circuits of a same color.

8. A method of manufacturing a display, comprising:
forming, in each of a plurality of pixel circuits that are arranged in a matrix form in columns and rows, a transistor whose conduction state is controlled by a drive signal received at a control terminal of the transistor; and
forming a scanner that has output stages that are arranged in a column direction and that each are configured to output the drive signal to a corresponding row of the plurality of pixel circuits,
wherein each of the output stages includes a given buffer that comprises transistors that have a channel length extending in a column direction, and
the transistors in the buffer are formed by solidification through irradiation with laser light that is moved for scanning in the column direction and has a predetermined wavelength.

9. The method of claim 8,
wherein those transistors of the given buffer of the output stages that have a channel length extending in the column direction and that are formed through irradiation with laser light that is moved for scanning in the column direction are arranged in one or more columns in which the transistors thereof are aligned with respect to each other in the column direction.

10. The method of claim 8,
wherein each of the given buffer is a final-stage buffer.

11. The method of claim 10,
wherein those transistors of the given buffer of the output stages that have a channel length extending in the column direction and that are formed through irradiation with laser light that is moved for scanning in the column direction are arranged in one or more columns in which the transistors thereof are aligned with respect to each other in the column direction.

12. The method of claim 8,
wherein the given buffer constitute an enable pulse buffer that generates an enable pulse of which phase has been corrected.

13. The method of claim 12,
wherein those transistors of the given buffer of the output stages that have a channel length extending in the column direction and that are formed through irradiation with laser light that is moved for scanning in the column direction are arranged in one or more columns in which the transistors thereof are aligned with respect to each other in the column direction.

14. The method of claim 8,
wherein the transistor of each of the plurality of pixel circuits is formed through irradiation with laser light that is moved for scanning in the column direction, and
the plurality of pixel circuits are arranged such that each column of the plurality of pixel circuits includes only ones of the plurality of pixel circuits of a same color.

15. A display comprising:
a pixel array part that includes a plurality of pixel circuits that are arranged in a matrix form in columns and rows, each of the plurality of pixel circuits having a transistor; and
a scanner configured to have output stages that are arranged in a predetermined direction, wherein the respective transistors of the plurality of pixel circuits are formed through irradiation with laser light that is moved for scanning in the predetermined direction, the plurality of pixel circuits are arranged in stripes that extend in the predetermined direction, wherein each of the stripes includes only ones of the plurality of pixel circuits of a same color, a conduction state of the transistor each of the plurality of pixel circuits is controlled by a drive signal received at a control terminal of the transistor, the output stages are configured to output the drive signal to respectively corresponding rows of the plurality of pixel circuits, and each of the output stages includes a given buffer that comprises transistors that have a channel length extending in the predetermined direction and that are formed through irradiation with laser light that is moved for scanning in the predetermined direction.

16. The display of claim 15,
wherein the transistor of each of the plurality of pixel circuits has a channel length extending in the predetermined direction.

17. The display of claim 15,
wherein the transistor of each of the plurality of pixel circuits has a channel length extending in a direction perpendicular to the predetermined direction.

18. The display of claim 15,
wherein the transistors of those ones of the plurality of pixel circuits that are included in a same stripe have respective channel lengths extending in a same direction as each other.

19. The display of claim 18,
wherein the transistors of those ones of the plurality of pixel circuits that are included in a given stripe have respective channel lengths extending in the predetermined direction and the transistors of those ones of the plurality of pixel circuits that are included in a stripe adjacent to the given stripe have respective channel lengths extending in a second direction perpendicular to the predetermined direction.

20. The display of claim 18
wherein the transistor of a given one of the plurality of pixel circuits has a channel length extending in the predetermined direction and the transistors of those ones of the plurality of pixel circuits that are adjacent to the given one of the plurality of pixel circuits in a column or row direction have respective channel lengths extending in a second direction perpendicular to the predetermined direction.

21. The display of claim 15,
wherein the plurality of pixel circuits are grouped into display pixels each comprising N ≥2 ones of the plurality of pixel circuits each having a different color than other ones of the plurality of pixel circuits in the same display pixel,
wherein the transistors of those ones of the plurality of pixel circuits that are included in a same display pixel have respective channel lengths extending in a same direction as each other.

22. The display of claim 21,
wherein the transistors of those ones of the plurality of pixel circuits that are included in a given display pixel have respective channel lengths extending in the predetermined direction,
the transistors of those ones of the plurality of pixel circuits that are included in a display pixel adjacent to the given display pixel in a row direction have respective channel lengths extending in a second direction perpendicular to the predetermined direction.

23. A method for manufacturing a display, comprising:
forming a plurality of pixel circuits arranged in a matrix form in columns and rows, where each of the plurality of pixel circuits includes a transistor whose conduction state is controlled by a drive signal received at a control terminal of the transistor, and forming a scanner configured to have output stages that are arranged in a predetermined direction, wherein the respective transistors of the plurality of pixel circuits are formed through irradiation with laser light that is moved for scanning in a predetermined direction, the plurality of pixel circuits are arranged in stripes that extend in the predetermined direction, wherein each of the stripes includes only ones of the plurality of pixel circuits of a same color, a conduction state of the transistor each of the plurality of pixel circuits is controlled by a drive signal received at a control terminal of the transistor, the output stages are configured to output the drive signal to respectively corresponding rows of the plurality of pixel circuits, and each of the output stages includes a given buffer that comprises transistors that have a channel length extending in the predetermined direction and that are formed through irradiation with laser light that is moved for scanning in the predetermined direction.

24. The method of claim 23,
wherein the transistor of each of the plurality of pixel circuits has a channel length extending in the predetermined direction.

25. The method of claim 23,
wherein the transistor of each of the plurality of pixel circuits has a channel length extending in a direction perpendicular to the predetermined direction.

26. The method of claim 23,
wherein the transistors of those ones of the plurality of pixel circuits that are included in a same stripe have respective channel lengths extending in a same direction as each other.

27. The method of claim 26,
wherein the transistors of those ones of the plurality of pixel circuits that are included in a given stripe have respective channel lengths extending in the predetermined direction and the transistors of those ones of the plurality of pixel circuits that are included in a stripe adjacent to the given stripe have respective channel lengths extending in a second direction perpendicular to the predetermined direction.)

28. The method of claim 26
wherein the transistor of a given one of the plurality of pixel circuits has a channel length extending in the predetermined direction and the transistors of those ones of the plurality of pixel circuits that are adjacent to the given one of the plurality of pixel circuits in a column or row direction have respective channel lengths extending in a second direction perpendicular to the predetermined direction.

29. The method of claim 23,
wherein the plurality of pixel circuits are grouped into display pixels each comprising N ≥2 ones of the plurality of pixel circuits each having a different color than other ones of the plurality of pixel circuits in the same display pixel, wherein the transistors of those ones of the plurality of pixel circuits that are included in a same display pixel have respective channel lengths extending in a same direction as each other.

30. The method of claim 29,
wherein the transistors of those ones of the plurality of pixel circuits that are included in a given display pixel have respective channel lengths extending in the predetermined direction,
the transistors of those ones of the plurality of pixel circuits that are included in a display pixel adjacent to the given display pixel in a row direction have respective channel lengths extending in a second direction perpendicular to the predetermined direction.

* * * * *